（12） United States Patent
Cuomo et al.

(10) Patent No.: US 6,784,085 B2
(45) Date of Patent: Aug. 31, 2004

(54) $M^{III}N$ BASED MATERIALS AND METHODS AND APPARATUS FOR PRODUCING SAME

(75) Inventors: Jerome J. Cuomo, Cary, NC (US); N. Mark Williams, Raleigh, NC (US); Andrew David Hanser, Raleigh, NC (US); Eric Porter Carlson, Raleigh, NC (US); Darin Taze Thomas, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 1 day.

(21) Appl. No.: 09/998,080

(22) Filed: Nov. 30, 2001

(65) Prior Publication Data

US 2002/0086534 A1 Jul. 4, 2002

Related U.S. Application Data

(60) Provisional application No. 60/250,297, filed on Nov. 30, 2000, and provisional application No. 60/250,337, filed on Nov. 30, 2000.

(51) Int. Cl.$^7$ ...................... H01L 21/28; H01L 21/3205
(52) U.S. Cl. ........................ 438/604; 438/604; 438/775
(58) Field of Search ............................... 438/602, 603, 438/604, 680, 681, 706, 710, 712, 718, 745, 775

(56) References Cited

U.S. PATENT DOCUMENTS 3,600,218 A   8/1971   Pennebaker
3,609,471 A   9/1971   Scace et al.

(List continued on next page.)

FOREIGN PATENT DOCUMENTS

JP             63-307254        12/1988

OTHER PUBLICATIONS

Huang et al., "Room–Temperature Ultraviolet Nanowire Nanolasers," Science, vol. 292, p. 1897–1899, (Jun. 8, 2001).

Yoshizawa et al., "Growth of Self–Organized GaN Nanostructures on Al2O3(0001) by RF–Radical Source Molecular Beam Epitaxy," Jpn. J. Appl. Phys., vol. 36, p. L459–L462, (Apr. 15, 1997).

Kusakabe et al., "Characterization of Overgrown GaN Layers on Nano–Columns Grown by RF–Molecular Beam Epitaxy," Jpn. J. Appl. Phys., vol. 40, p. L192–L194, (Mar. 1, 2001).

Hashimoto et al., "Formation of GaN Nano–Column Structure by Nitridation," Materials Science Forum, Trans Tech Publications, Ltd. (Switzerland), vols. 264–268, p. 1129–1132, (Jul. 1, 1998).

*Primary Examiner*—David Nhu
(74) *Attorney, Agent, or Firm*—Jenkins, Wilson & Taylor, P.A.

(57) ABSTRACT

A high deposition rate sputter method is utilized to produce bulk, single-crystal, low-defect density Group III nitride materials suitable for microelectronic and optoelectronic devices and as substrates for subsequent epitaxy, and to produce highly oriented polycrystalline windows. A template material having an epitaxial-initiating growth surface is provided. A Group III metal target is sputtered in a plasma-enhanced environment using a sputtering apparatus comprising a non-thermionic electron/plasma injector assembly, thereby to producing a Group III metal source vapor. The Group III metal source vapor is combined with a nitrogen-containing gas to produce a reactant vapor species comprising Group III metal and nitrogen. The reactant vapor species is deposited on the growth surface to produce a single-crystal $M^{III}N$ layer thereon. The template material is removed, thereby providing a free-standing, single-crystal $M^{III}N$ article having a diameter of approximately 0.5 inch or greater and a thickness of approximately 50 microns or greater.

49 Claims, 15 Drawing Sheets

U.S. PATENT DOCUMENTS

| | | | | |
|---|---|---|---|---|
| 3,716,759 | A | 2/1973 | Scace et al. | |
| 4,394,400 | A | 7/1983 | Green et al. | |
| 4,407,712 | A | 10/1983 | Henshaw et al. | |
| 4,431,473 | A | 2/1984 | Okano et al. | |
| 4,491,560 | A * | 1/1985 | Fujii et al. | 420/429 |
| 4,521,286 | A | 6/1985 | Horwitz | |
| 4,588,490 | A | 5/1986 | Cuomo et al. | |
| 4,637,853 | A | 1/1987 | Bumble et al. | |
| 4,727,047 | A | 2/1988 | Bozler et al. | |
| 4,824,544 | A | 4/1989 | Mikalesen et al. | |
| 4,915,805 | A | 4/1990 | Rust | |
| 4,959,136 | A | 9/1990 | Hatwar | |
| 4,963,239 | A | 10/1990 | Shimamura et al. | |
| 4,966,677 | A | 10/1990 | Aichert et al. | |
| 4,985,742 | A | 1/1991 | Pankove | |
| 5,073,245 | A | 12/1991 | Hedgcoth | |
| 5,228,963 | A | 7/1993 | Rose | |
| 5,234,560 | A | 8/1993 | Kadlec et al. | |
| 5,270,263 | A * | 12/1993 | Kim et al. | 438/603 |
| 5,290,393 | A | 3/1994 | Nakamura | |
| 5,306,662 | A | 4/1994 | Nakamura et al. | |
| 5,356,608 | A | 10/1994 | Gebhardt | |
| 5,393,993 | A | 2/1995 | Edmond et al. | |
| 5,556,519 | A | 9/1996 | Teer | |
| 5,573,742 | A | 11/1996 | Gebhardt | |
| 5,587,014 | A | 12/1996 | Iyechika et al. | |
| 5,620,557 | A | 4/1997 | Manabe et al. | |
| 5,637,531 | A | 6/1997 | Porowski et al. | |
| 5,679,152 | A | 10/1997 | Tischler et al. | |
| 5,686,738 | A * | 11/1997 | Moustakas | 257/103 |
| 5,786,606 | A | 7/1998 | Nishio et al. | |
| 5,838,029 | A | 11/1998 | Shakuda | |
| 5,858,086 | A | 1/1999 | Hunter | |
| 5,868,837 | A | 2/1999 | DiSalvo et al. | |
| 5,876,573 | A | 3/1999 | Moslehi et al. | |
| 5,882,538 | A * | 3/1999 | Martin et al. | 216/71 |
| 5,914,059 | A * | 6/1999 | Marcin, Jr. et al. | 219/121.66 |
| 5,915,194 | A | 6/1999 | Powell et al. | |
| 5,919,305 | A | 7/1999 | Solomon | |
| 5,954,874 | A | 9/1999 | Hunter | |
| 5,962,875 | A | 10/1999 | Motoki et al. | |
| 5,970,314 | A | 10/1999 | Okahisa et al. | |
| 5,972,109 | A | 10/1999 | Hunter | |
| 6,020,602 | A | 2/2000 | Sugawara et al. | |
| 6,045,612 | A | 4/2000 | Hunter | |
| 6,063,185 | A | 5/2000 | Hunter | |
| 6,066,205 | A | 5/2000 | Hunter | |
| 6,071,795 | A | 6/2000 | Cheung et al. | |
| 6,096,130 | A | 8/2000 | Kimura et al. | |
| 6,136,093 | A | 10/2000 | Shiomi et al. | |
| 6,146,457 | A | 11/2000 | Solomon | |
| 6,153,010 | A | 11/2000 | Kiyoku et al. | |
| 6,177,688 | B1 | 1/2001 | Linthicum et al. | |
| 6,218,280 | B1 * | 4/2001 | Kryliouk et al. | 438/607 |
| 6,221,684 | B1 | 4/2001 | Sugawara et al. | |
| 6,225,650 | B1 | 5/2001 | Tadatomo et al. | |
| 6,252,261 | B1 | 6/2001 | Usui et al. | |
| 6,254,675 | B1 | 7/2001 | Aldinger et al. | |
| 6,255,198 | B1 | 7/2001 | Linthicum et al. | |
| 6,265,289 | B1 | 7/2001 | Zheleva et al. | |
| 6,270,569 | B1 | 8/2001 | Shibata et al. | |
| 6,273,948 | B1 | 8/2001 | Porowski et al. | |
| 6,277,664 | B1 | 8/2001 | Lozykowski et al. | |
| 6,288,417 | B1 | 9/2001 | Nickel et al. | |
| 6,290,774 | B1 | 9/2001 | Solomon et al. | |
| 6,350,666 | B2 * | 2/2002 | Kryliouk | 438/604 |
| 6,372,041 | B1 | 4/2002 | Cho et al. | |
| 6,398,867 | B1 | 6/2002 | D'Evelyn et al. | |
| 6,406,540 | B1 | 6/2002 | Harris et al. | |
| 6,407,409 | B2 | 6/2002 | Cho et al. | |
| 6,413,627 | B1 | 7/2002 | Motoki et al. | |
| 6,426,512 | B1 * | 7/2002 | Ito et al. | 257/12 |
| 6,429,402 | B1 * | 8/2002 | Dixon et al. | 219/121.63 |
| 6,440,823 | B1 | 8/2002 | Vaudo et al. | |
| 6,468,347 | B1 | 10/2002 | Motoki et al. | |
| 2001/0008656 | A1 | 7/2001 | Tischler et al. | |

* cited by examiner

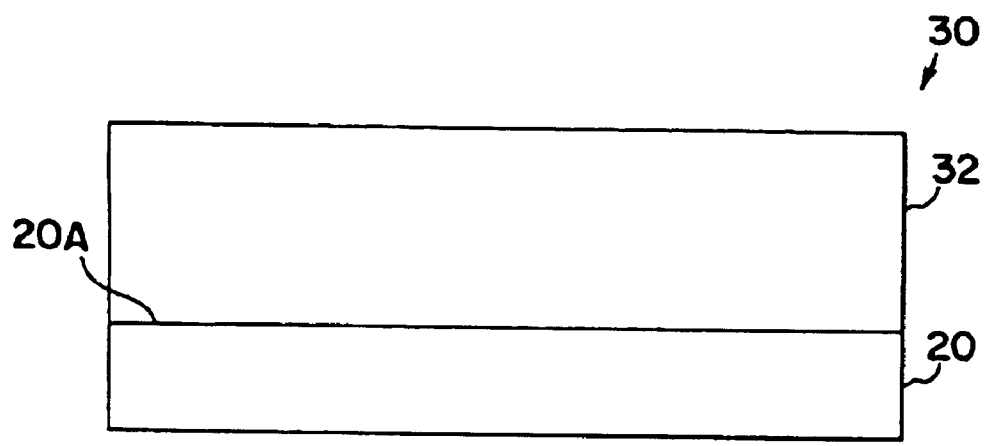
F I G. 3A
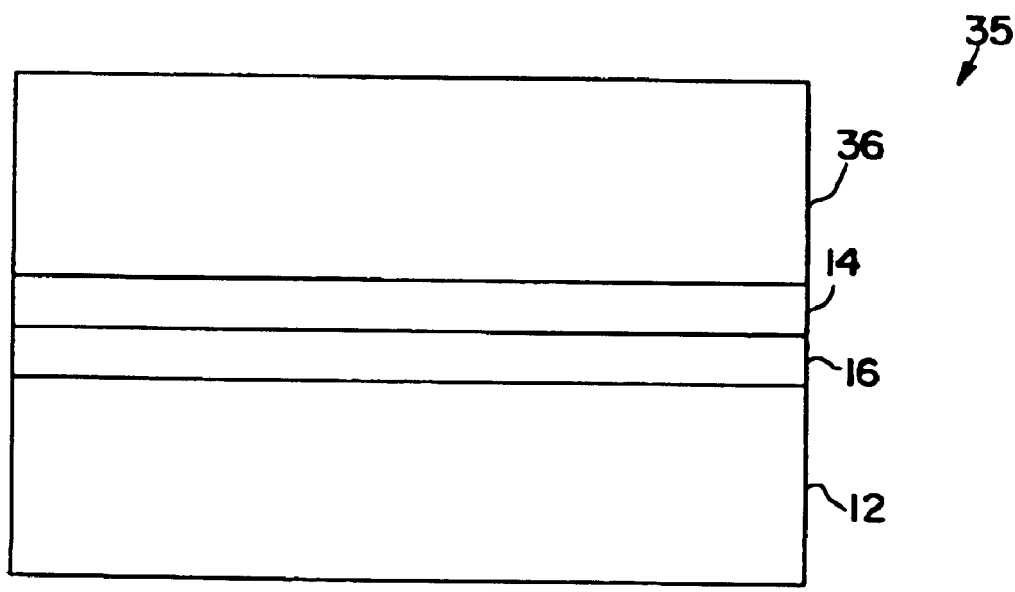
F I G. 3B

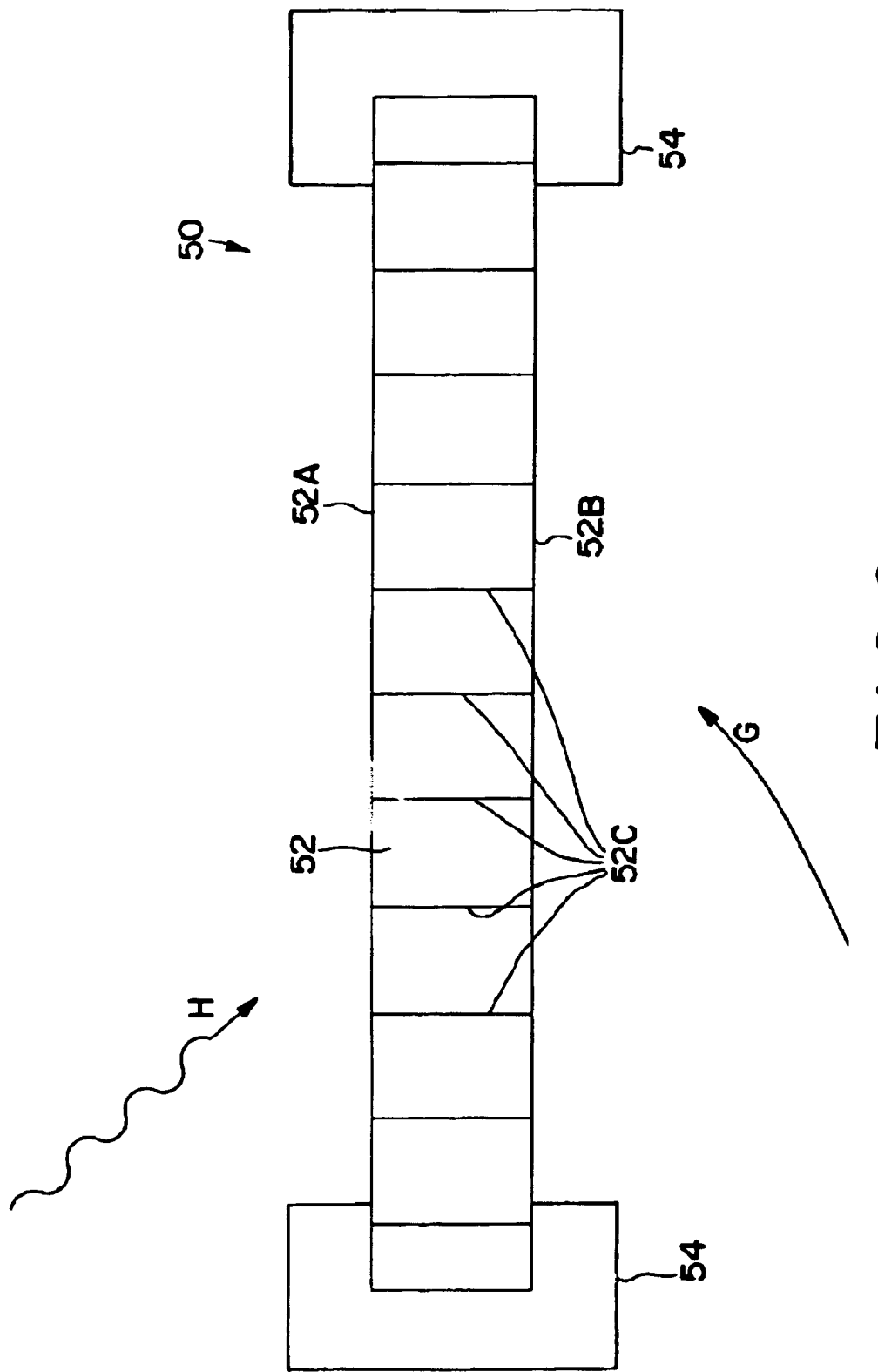

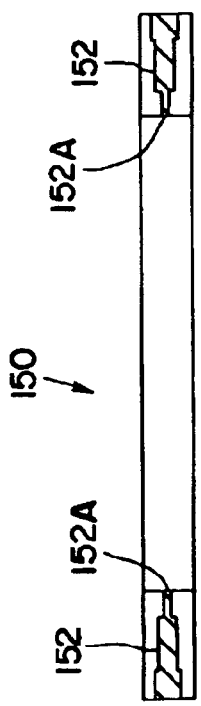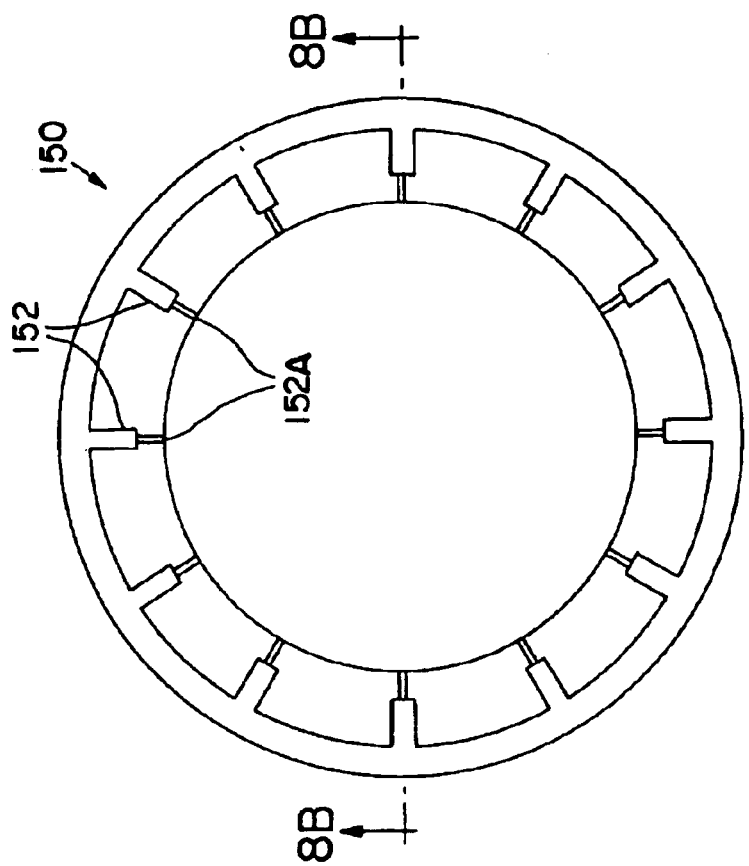

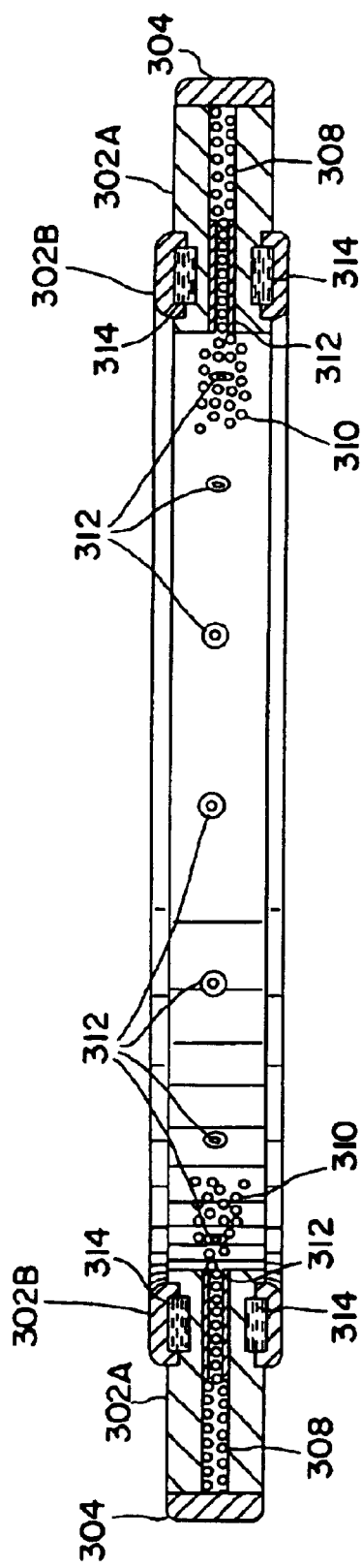
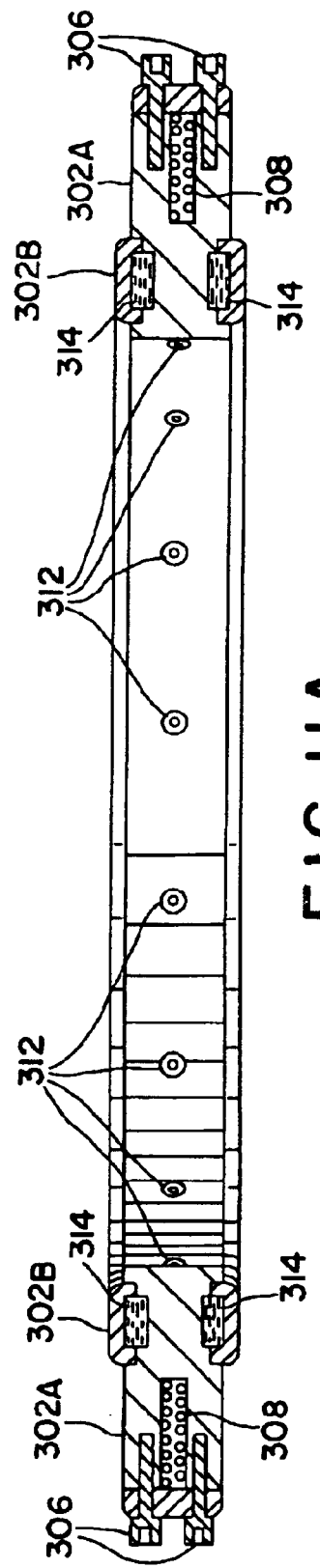

M$^{III}$N BASED MATERIALS AND METHODS AND APPARATUS FOR PRODUCING SAME

RELATED APPLICATIONS

This application claims the benefit of U.S. Provisional Patent Application Serial Nos. 60/250,297, filed Nov. 30, 2000; and 60/250,337, filed Nov. 30, 2000; the disclosures of which are incorporated herein by reference in their entireties.

TECHNICAL FIELD

The present invention is generally directed to the production of Group III metal nitride materials for use as free-standing articles as well as substrates for further processes and/or microelectronic and optoelectronic devices. In particular, the present invention is directed to the production of low-defect density, single-crystal materials and highly-oriented polycrystalline materials utilizing enhanced sputtering techniques.

BACKGROUND

A wide variety of techniques exist for depositing thin films onto substrates in order to achieve desirable properties which are either different from, similar to, or superior to the properties of the substrates themselves. Thin films are employed in many kinds of optical, electrical, magnetic, chemical, mechanical and thermal applications. Optical applications include reflective/anti-reflective coatings, interference filters, memory storage in compact disc form, and waveguides. Electrical applications include insulating, conducting and semiconductor devices, as well as piezoelectric drivers. Magnetic applications include memory discs. Chemical applications include barriers to diffusion or alloying (e.g., galling), protection against oxidation or corrosion, and gas or liquid sensors. Mechanical applications include tribological (wear-resistant) coatings, materials having desirable hardness or adhesion properties, and micromechanics. Thermal applications include barrier layers and heat sinks.

Bulk materials can be used as substrates upon which microelectronic and optical devices are fabricated. Wide bandgap semiconductor materials such as gallium nitride, aluminum nitride, indium nitride and their alloys are being studied for their potential application in microelectronics and opto-electronics. These materials are particularly well suited for short wavelength optical applications, such as green, blue and UV light emitting devices (LEDs and LDs), and visible and solar-blind UV detectors. The use of UV or blue GaN-based LEDs makes possible the fabrication of solid state white light sources, with higher efficiencies and lifetimes 10 to 100 times longer than conventional sources. Additionally, GaN has a region of negative differential mobility with a high peak electron velocity and high-saturated velocity, which can be used for fabricating high-speed switching and microwave components. P-type doping of GaN and AlGaN with relatively high hole concentrations is now readily achieved, and ohmic and Schottky contacts have been characterized for n- and p-type materials. Thus, many of the above devices have or potentially have large, technologically important markets. Such markets include display technology, optical storage technology, and space-based communications and detection systems. Other applications include high temperature microelectronics, opto-electronic devices, piezoelectric and acousto-optic modulators, negative-electron affinity devices and radiation/EMP hard devices for military and space uses.

Attempts to grow low-defect density gallium nitride (GaN) thin films heteroepitaxially on substrates such as sapphire and silicon carbide (SiC) have had limited success. GaN materials heteroepitaxially grown on these substrates suffer from large concentrations of threading defects, typically on the order of $10^{-8}$–$10^{-10}$ cm$^{-2}$, due to the large lattice mismatch between the film and substrate. Threading defects increase leakage currents in diode and FET structures and act as a significant source of noise in photodetectors. As a result, the operation of high performance devices, such as high-speed, high-sensitivity UV photodetectors, and high power, high frequency microelectronic devices, is presently limited. Buffer layers of AlN, GaN, and other materials have been used to reduce the lattice mismatch. However, threading defects and low angle grain boundaries remain in the films. Differences between the film and substrate thermal expansion coefficients also result in stresses in the films.

Accordingly, homoepitaxial growth of GaN thin films on bulk GaN substrates is of great interest. The use of GaN substrates would eliminate the problems due to lattice mismatch and thermal expansion mismatch. Unfortunately, the availability of GaN substrates has been limited due to conventional processing capabilities. This problem has hindered the development of devices based on GaN and related nitride semiconductors. Several obstacles exist to the successful manufacturing and commercializing of high device-quality Group III nitride-based materials, whether in bulk, single-crystal, polycrystalline or epitaxial form, for electronics and other applications. These obstacles generally include cost, reproducibility, and purity.

For instance, gallium nitride has a high equilibrium vapor pressure of nitrogen that results in its decomposition at elevated temperatures. The solubility of nitrogen in gallium metal at room temperature and pressure is very low. As a result, conventional crystal growth methods to produce GaN are not practical. This has led to the development of several alternate bulk growth methods, including high-temperature, high-pressure (15 kbar) solution growth, evaporation, and sublimation.

Currently, aluminum nitride and gallium nitride exist only as polycrystalline or powder forms, or in thin films. Polycrystalline bulk aluminum nitride can be manufactured using powder processing techniques. This process has not yielded semiconductor-grade single crystal material. Formidable problems are associated with such techniques, beginning with the production of pure aluminum nitride powders and then the sintering of oxygen-free and defect-free aluminum nitride. Some of these problems include the production of both high-purity and uniform particle-size powders. The highest purity powders can contain up to 1% of oxygen and binders, such as $Y_2O_3$, that are needed to produce aluminum nitride with a high density. Therefore, high density is achievable at the expense of contamination. Sintering of these aluminum nitride powders is also a difficult process. The covalent nature of aluminum nitride prevents densification of pure aluminum nitride at low temperatures. Aluminum nitride decomposes at high temperatures, such as above 1600° C., thereby preventing densification. Hence, costly sintering aids such as high pressures and impurities are required for producing high-density material. Other problems associated with powder processing of aluminum nitride include maintaining the purity and integrity of the powder, controlling the environment at high sintering temperatures, and the production of defect-free parts. Aluminum nitride is very difficult to manufacture using powder processing techniques without introducing contamination that will have adverse effects on the optical and thermal properties of the material. These impurities can be present in the crystalline lattice structure, and can migrate to the grain boundaries during sintering, causing the infrared absorbance to be high.

As disclosed hereinbelow, it has now been discovered that enhanced sputtering techniques, which are physical vapor deposition (PVD) techniques, can be feasibly utilized to produce low-defect density Group III metal nitride materials of bulk thickness and of device-quality crystal. Magnetron sputtering is traditionally associated with thin film deposition. An advantage of sputter synthesis is that high purity compounds can be formed directly from the high purity source materials. Moreover, the synthesis can be achieved under highly controlled conditions. Nitrogen and Group III metals such as aluminum are readily available, from multiple sources, in ultra-high purity grades (e.g., 99.9999%) for the microelectronics industry. Sputter synthesis is currently the process that most effectively eliminates hydrogen from the bulk, since the sputter environment is controllable to ultra-high vacuum conditions. Through sputter synthesis of Group III nitrides, it is possible to obtain materials that have properties near the bulk properties. Since this takes place under ultra-high vacuum conditions, hydrogen and oxygen can be eliminated from the material. Reactive sputtering has the advantage of producing high purity materials with high densities, and ease of fabrication of quality crystalline material.

However, traditional magnetron sputtering has several drawbacks, which has made it very difficult to produce bulk materials. These drawbacks include unwanted target reactions, transport limitations, and low growth rates. During reactive magnetron sputtering, micro-arcs can occur on the cathode surface which cause imperfections in the deposited material. Another problem associated with this process is the "disappearing anode" effect, in which the entire anode becomes covered by randomly grown insulating layers. Also related to this process is the problematic formation of an insulating nitride layer on the target surface that increases the impedance of the cathode until the target becomes "poisoned" or completely insulating. This results in a drastic decrease in deposition rates to almost zero when the target becomes too nitrided to operate. Materials transport can also be a problem in bulk crystal growth using magnetron sputtering since there can be a significant loss of material to the sidewalls.

The present invention is provided to address these and other problems associated with the growth of thin films and bulk materials.

DISCLOSURE OF THE INVENTION

According to one method of the present invention, a single-crystal $M^{III}N$ article is produced. A template material having an epitaxial-initiating growth surface is provided. A Group III metal target is sputtered in a plasma-enhanced environment to produce a Group III metal source vapor. The Group III metal source vapor is combined with a nitrogen-containing gas to produce reactant vapor species comprising the Group III metal and nitrogen. The reactant vapor species is deposited on the growth surface to produce a single-crystal $M^{III}N$ lever thereon. In one aspect, the single-crystal $M^{III}N$ layer is grown as a thin film. i.e., with a thickness of approximately 10 to 10,000 mn (0.01 to 10 microns), for use as a seed crystal upon which a bulk, second $M^{III}N$ layer can be grown. In another aspect growth of the $M^{III}N$ layer is permitted to continue beyond the thin film range until its thickness is sufficient to ensure that the resulting bulk crystal has a low enough defect density to be considered as device-quality. In a further aspect, the $M^{III}N$ layer is grown to a bulk thickness and the template material is removed, thereby providing a free-standing, single-crystal $M^{III}N$ article having a diameter of approximately 0.5 inch or greater and a thickness of approximately 50 microns or greater.

Methods of the present invention can be implemented by providing a novel sputter material transport device to enhance thin-film and bulk material manufacturing processes. The novel transport device is capable of ultra-high deposition and growth rates, making it feasible for growing thick material and increasing throughput in manufacturing processes. The transport device can be used both to grow bulk crystalline materials and to deposit thin films and epitaxial layers onto bulk substrates. Generally, as compared to other sputter processes, the transport device has the advantages of lowered processing pressure, higher deposition rates, higher ionization efficiency, and a controlled processing environment with no contamination. The transport device utilizes an enhanced sputtering process to rapidly deposit both metallic and dielectric materials. This enhancement allows the process to overcome the limitations of conventional PVD techniques.

The transport device according to the present invention can achieve growth rates in excess of ten times those achieved by any other direct deposition process. As currently tested, the device is capable of depositing single or polycrystalline material at a rate in excess of approximately 60 $\mu$m/hr. This high deposition rate allows for high throughput capabilities and the possibility of manufacturing bulk materials in short time periods. The device has increased growth rates due to the very high ionization efficiencies, which enhances the sputtering process without "poisoning" the sputtering material. The ability to deposit material at high deposition rates will have many commercial applications, including high-throughput manufacturing processes of thick films of exotic materials. Moreover, high-quality material can be deposited in a cost-effective manner. It is also projected that the device will aid in the commercialization of bulk dielectric and semiconductor materials and will have numerous applications to other materials.

The transport device surpasses present technology by offering a non-contaminating method, in the form of a triode sputtering arrangement, to increase the ionization efficiency and hence the overall deposition rate. The device also has the advantage of a cooler operating temperature than a thermionic hollow cathode configuration, allowing the injector means of the device to be composed of low-temperature materials, and thus can apply to a broad range of materials as compared to conventional processes. The transport device can increase the deposition rate of the target material and lower the sputtering pressure, thereby enabling a line-of-sight deposition process.

The transport device is capable of growing bulk material such as aluminum nitride and other Group III nitrides and also is capable of depositing metal in deep trenches for the semiconductor industry.

According to the present invention, the transport device includes a magnetron source and a non-thermionic electron (or, in effect, a plasma) injector assembly to enhance magnetron plasma. Preferably, the electron/plasma injector is disposed just below the surface of a cathode target material, and includes a plurality of non-thermionic, hollow cathode-type injector devices for injecting electrons into a magnetic field produced by a magnetron source. The injector can be scaled in a variety of configurations (e.g., circular or linear)

to accommodate various magnetron shapes. When provided in the form of a circular ring, the injector includes multiple hollow cathodes located around the inner diameter of the ring.

The transport device constitutes an improvement over previously developed hollow cathode enhanced magnetron sputtering devices that rely on thermionic emission. The device of the present invention comprises a non-thermionic electron emitter that operates as a "cold" plasma source and can be composed of the same material as its sputtering target. The injector can be manufactured out of high-purity metals (e.g., 99.9999%), thereby eliminating a source of contamination in the growing film. The addition of the injector to the magnetron sputtering process allows higher deposition rates as compared to rates previously achieved by conventional magnetron sputtering devices. Moreover, the transport device takes advantage of the hollow cathode effect by injecting electrons and plasma into the magnetic field to increase plasma densities without the contamination problem associated with a traditional, thermionic-emitting tantalum tip. As disclosed above, the transport device is further characterized by a decreased operating pressure and an increased ionization rate over conventional magnetron sputtering.

Therefore, according to another method of the present invention, a single-crystal $M^{III}N$ article is produced by using a sputtering apparatus comprising a non-thermionic electron/plasma injector assembly to produce the Group III metal source vapor from a Group III metal target. The Group III metal source vapor is combined with a nitrogen-containing gas to produce reactant vapor species comprising Group III metal and nitrogen. The reactant vapor species is deposited on the growth surface of the template material to produce a single-crystal $M^{III}N$ layer thereon.

The sputter transport device comprises a sealable or evacuable, pressure controlled chamber defining an interior space, a target cathode disposed in the chamber, and a substrate holder disposed in the chamber and spaced at a distance from the target cathode. The target cathode is preferably bonded to a target cathode holder and negatively biased. A magnetron assembly is disposed in the chamber proximate to the target cathode. A negatively-biased, non-thermionic electron/plasma injector assembly is disposed between the target cathode and the substrate holder. The injector assembly fluidly communicates with a reactive gas source and includes a plurality of hollow cathode-type structures. Each hollow cathode includes an orifice communicating with the interior space of the chamber.

According to one aspect of the present invention, the electron/plasma injector assembly is adapted for non-thermionically supplying plasma to a reaction chamber. The injector assembly comprises a main body and a plurality of replaceable or interchangeable gas nozzles. The main body has a generally annular orientation with respect to a central axis, and includes a process gas section and a cooling section. The process gas section defines a process gas chamber and the cooling section defines a heat transfer fluid reservoir. The gas nozzles are removably disposed in the main body in a radial orientation with respect to the central axis and in heat transferring relation to the heat transfer fluid reservoir. Each gas nozzle provides fluid communication between the process gas chamber and the exterior of the main body.

The methods of the present invention can be utilized to successfully produce device-quality articles.

According to one embodiment of the present invention, a bulk single-crystal $M^{III}N$ article has a diameter of approximately 0.5 inch to approximately 12 inches and a thickness of approximately 50 microns or greater.

According to another embodiment of the present invention, a single-crystal $M^{III}N$ article is produced in wafer form, having a thickness ranging from approximately 50 microns to approximately 1 mm.

According to yet another embodiment of the present invention, a single-crystal $M^{III}N$ article is produced in boule form, having a diameter of approximately 2 inches or greater and a thickness ranging from approximately 1 mm to greater than approximately 100 mm.

According to still another embodiment of the present invention, the single-crystal $M^{III}N$ layer is used as a seed crystal, such that additional reactant vapor species comprising the Group III metal and nitrogen can be deposited the $M^{III}N$ layer to produce a bulk, homoepitaxially grown $M^{III}N$ article.

In conjunction with the methods of the present invention wherein a bulk $M^{III}N$ article is produced, a wafer can be cut from the $M^{III}N$ article and an epitaxial layer subsequently deposited on the wafer.

The single-crystal $M^{III}N$ layers or articles produced according to the methods of the present invention can be formed at a growth rate greater than approximately 10 microns/hour.

In conjunction with the methods of the present invention, microelectronic or optoelectronic devices or components can be fabricated on the $M^{III}N$ layers or articles, or on any additional layer grown on the $M^{III}N$ layers or articles.

According to a further embodiment of the present invention, a highly-oriented polycrystalline Group III nitride material is provided. The material has an elongate surface and a plurality of grain boundaries oriented substantially normal to the elongate surface. Thermal conductivity is high (i.e., promoted or enhanced) through the thickness of the material in a direction substantially normal to the elongate surface, and is low (i.e., impeded) in a direction substantially parallel to the elongate surface. The material is transparent to radiative energy in the infrared spectrum, the microwave spectrum, or both spectra, along the direction substantially normal to the elongate surface. As part of the growth process of the material, the material can be bonded to a metallic frame and employed in applications in which its directional thermal conductivity and/or its transparency is advantageous.

According to a further method of the present invention, a window is produced that is adapted to transmit radiative energy in the infrared and/or microwave spectra. A negatively-biased target cathode including a target material is provided in a sealed chamber. A metallic frame is provided in the chamber and spaced at a distance from the target cathode. An operating voltage is applied to the target cathode to produce an electric field within the chamber. A magnetron assembly is provided in the chamber to produce a magnetic field within the chamber. A negatively-biased, non-thermionic electron/plasma injector assembly is provided between the target cathode and the metallic frame to create an intense plasma proximate to the target cathode. A background gas is introduced into the chamber to provide an environment for generating a plasma medium. A portion of the target material is sputtered and transported through the plasma medium toward the metallic frame.

It is therefore an object of the present invention to provide low-defect density, single-crystal Group III nitride articles, substrates and device layers characterized by purities and sizes that previously have been unattainable.

It is another object of the present invention to provide a novel sputter material transport method and device capable of ultra-high deposition and growth rates of low-defect density Group III nitride materials.

It is a further object of the present invention to provide a polycrystalline material in bulk form which can transmit infrared and/or microwave energy.

Some of the objects of the invention having been stated hereinabove, other objects will become evident as the description proceeds when taken in connection with the accompanying drawings as best described hereinbelow.

BRIEF DESCRIPTION OF THE DRAWINGS

FIG. 3A is a side elevation view of the bulk article illustrated in FIG. 2 with an additional layer deposited thereon;

FIG. 3B is a side elevation view of a heterostructure similar to that illustrated in FIG. 1 with an additional layer deposited thereon;

FIG. 6 is a side elevation view of a window including a highly transparent, highly oriented polycrystalline material produced according to the present invention;

FIG. 8A is a top plan view of an electron/plasma injector assembly provided according to one embodiment of the present invention;

FIG. 8B is a cut-away vertical cross-sectional view of the injector assembly illustrated in FIG. 8A taken along line 8B—8B thereof;

FIG. 11A is a vertical cross-sectional view of the injector assembly illustrated in FIG. 11 taken along line 11A—11A thereof;

FIG. 11B is a vertical cross-sectional view of the injector assembly illustrated in FIG. 11 taken along line 11B—11B thereof;

DETAILED DESCRIPTION OF THE INVENTION

Figure 1:
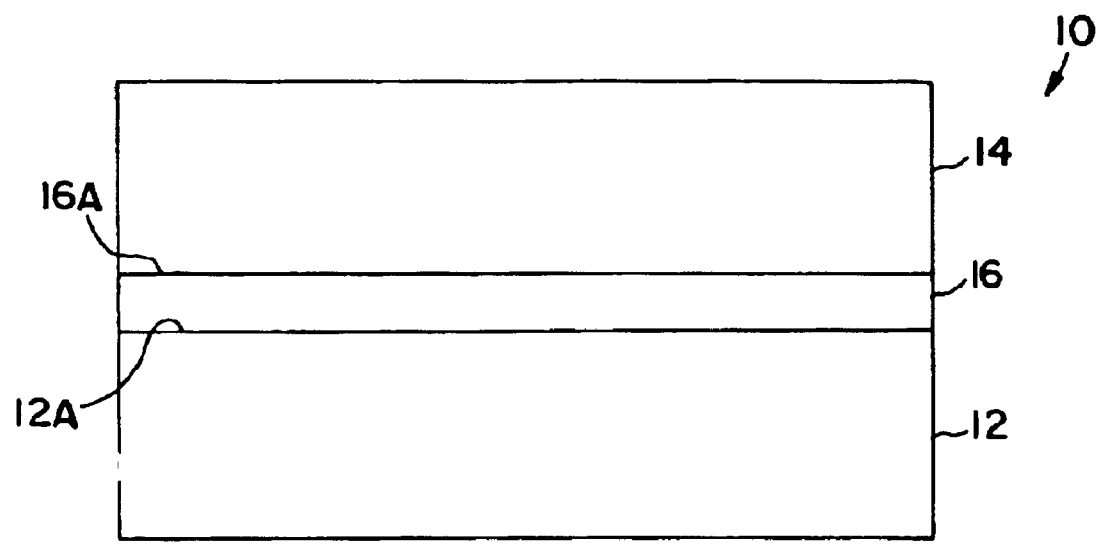
FIG. 1 is a side elevation view of a heterostructure provided in accordance with the present invention.

For purposes of the present disclosure, it will be understood that when a given component such as a layer, region or substrate is referred to herein as being disposed or formed "on" another component, that given component can be directly on the other component or, alternatively, intervening components (for example, one or more buffer layers, interlayers, electrodes or contacts) can also be present. It will be further understood that the terms "disposed on" and "formed on" are used interchangeably to describe how a given component is positioned or situated in relation to another component. Hence, the terms "disposed on" and "formed on" are not intended to introduce any limitations relating to particular methods of material transport, deposition, or fabrication.

The terms "$M^{III}N$," "$M^{III}$nitrides," and "Group III nitrides" are used herein to describe binary, ternary, and quaternary Group III nitride based compounds such as aluminum nitride, gallium nitride, indium nitride, aluminum gallium nitride, indium gallium nitride and aluminum indium gallium nitride, and alloys thereof, with or without added dopants or other intentional impurities, as well as all possible crystalline structures and morphologies, and any derivatives or modified compositions thereof.

Terms relating to crystallographic orientations, such as Miller indices and angles in relation to the plane of a layer of material, are intended herein to cover not only the exact value specified (e.g., (116), 45° and so on) but also any small deviations from such exact value that might be observed.

As used herein, the term "epitaxy" generally refers to the formation of a single-crystal film structure on top of a crystalline substrate. Epitaxy can be broadly classified into two categories, namely homoepitaxy and heteroepitaxy. In the case of homoepitaxy, the film and the underlying substrate have the same structural relationships. Reasons for extending the substrate through the deposition thereon of an epitaxial film layer, or "epilayer," of the same composition include the observations that the epitaxial layer (1) is typically much more free of defects as compared to the substrate, (2) is typically purer than the substrate, and (3) can be doped independently of the substrate. The respective lattice parameters of the epilayer and substrate are perfectly matched, with no interfacial bond straining.

In heteroepitaxy, on the other hand, the film and substrate have different compositions. Moreover, the respective lattice parameters are, by definition and to a varying degree, mismatched in the case of heteroepitaxy. Heteroepitaxy has been accomplished in some processes that result in a quite small lattice mismatch, such that the heterojunction interfacial structure is similar to a homoepitaxial structure. Nevertheless, thermal mismatch (i.e., a difference in the respective thermal expansion coefficients between the film and substrate) as well as distinctions in the respective chemistries of the film and substrate can exist to degrade electronic properties and interface quality. If the lattice parameters are significantly mismatched, relaxed epitaxy or strained epitaxy results. In the case of relaxed epitaxy, misfit dislocation defects form at the interface between the film and the substrate. In the case of strained epitaxy, the respective lattices of the film and the substrate tend to strain in order to accommodate their differing crystallographies.

As used herein, the term "device" is interpreted to have a meaning interchangeable with the term "component."

Referring now to FIG. 1, a heterostructure, generally designated 10, is illustrated according to the invention. Heterostructure 10 comprises a base substrate 12 on which a single-crystal, low-defect density $M^{III}N$ layer 14 is epitaxially grown. Preferably, base substrate has a diameter of 0.5 inch or greater. Base substrate 12 has a growth surface 12A having a composition and structure that enables base substrate 12 to serve as a template for the epitaxial growth of $M^{III}N$ layer 14 thereon. Alternatively, a buffer layer or interlayer 16 is grown on base substrate 12 so as to provide a suitable epitaxy-initiating growth surface 16A for $M^{III}N$ layer 14.

Non-limiting examples of material compositions suitable for use as base substrate 12 include sapphire, silicon, silicon carbide, diamond, lithium gallate, lithium aluminate, ScAlMgO$_4$, zinc oxide, spinel, magnesium oxide, gallium arsenide, glass, tungsten, molybdenum, hafnium, hafnium nitride, zirconium, zirconium nitride, carbon, silicon-on-insulator, carbonized silicon-on-insulator, carbonized silicon-on-silicon, and gallium nitride. Moreover, the particular base substrate selected could be characterized as being a conductive substrate, an insulating substrate, a semi-insulating substrate, a twist-bonded substrate, a compliant substrate, or a patterned substrate.

Non-limiting examples of material compositions suitable for use as interlayer 16 include gallium nitride, aluminum nitride, indium nitride, zinc oxide, silicon carbide, and their alloys. Interlayer 16 could also be composed of SiO$_2$, SiN, diamond, lithium gallate, lithium aluminate, zinc oxide, spine, magnesium oxide, gallium arsenide, tungsten, molybdenum, hafnium, hafnium nitride, zirconium, zirconium nitride, and carbon.

Preferably, base substrate 12 has a thermal coefficient of expansion that is substantially equal to that of $M^{III}N$ layer 14 in order to minimize thermal mismatch. When interlayer 16 is first deposited on growth surface 12A, however, thermal mismatch as between base substrate 12 and $M^{III}N$ layer 14 is of less concern.

According to one method of the invention, base substrate 12 and a Group III metal target are loaded into a sputter deposition chamber. A highly energetic plasma-enhanced environment is generated in the chamber, using a suitable background gas such as argon. Separate nitrogen-containing source gas is conducted into the chamber. Alternatively, the gas utilized to generate the plasma could also be used as the reactant source gas, in which case the background gas provides the nitrogen species. The Group III metal target is sputtered to produce a Group III metal source vapor. The Group III metal source vapor combines with the nitrogen-containing gas, which is characterized as including one or more species such as diatomic nitrogen, atomic nitrogen, nitrogen ions, and partially ionized nitrogen, as well as nitrogen-containing compounds such as ammonia. As a result, reactant vapor species comprising components of the Group III metal and the nitrogen are produced within the reaction chamber, and are deposited on growth surface 12A of base substrate 12 (or on growth surface 16A when first depositing buffer layer 16). The as-deposited reactant vapor species grows epitaxially on growth surface 12A to produce single-crystal $M^{III}N$ layer 14. $M^{III}N$ layer 14 can be doped by conducting conventional doping methods, such as by introducing dopant-containing gases into the reaction chamber under controlled conditions. Accordingly. $M^{III}N$ layer 14 can comprise an intrinsic $M^{III}N$ material, a doped $M^{III}N$ material, or an $M^{III}N$ alloy or compound containing greater than 50% $M^{III}N$ and N.

In one aspect of the invention, the growth of $M^{III}N$ layer 14 is permitted to continue until its thickness is sufficient to ensure that the bulk crystal has a defect density low enough to be considered as device-quality. In addition, $M^{III}N$ layer 14 can be rotated as it grows according to conventional methods. The structure is then removed from the reaction chamber, and base substrate 12 is separated or removed from $M^{III}N$ layer 14. The technique employed to remove base substrate 12 from $M^{III}N$ layer 14 can be, for example, polishing, chemomechanical polishing, laser-induced liftoff, cleaving, wet etching, or dry etching. The choice of the removal technique will depend on the particular composition of base substrate 12. Similarly, if wet etching is desired, the choice of the etchant will likewise depend on the particular composition of base substrate 12. Moreover, if dry etching is desired, the choice of the particular dry etching technique will likewise depend on the particular composition of base substrate 12.

Figure 2:
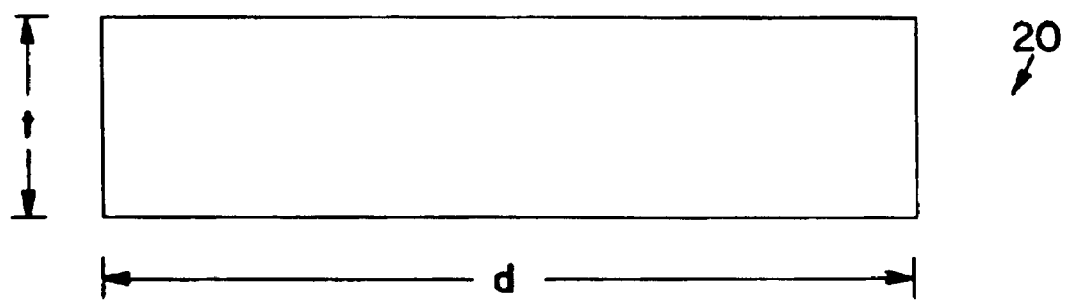
FIG. 2 is a side elevation view of a free-standing, bulk article produced according to the present invention.
Figure 4A:
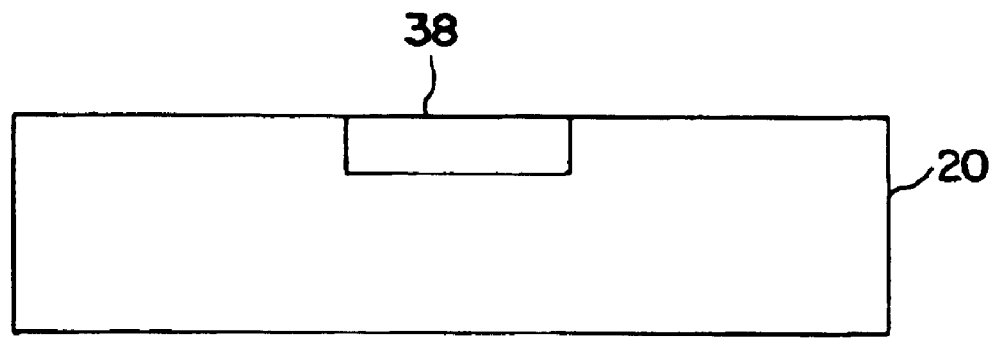
FIG. 4A is a side elevation view of the bulk article illustrated in FIG. 2 with a device fabricated thereon.
Figure 4B:
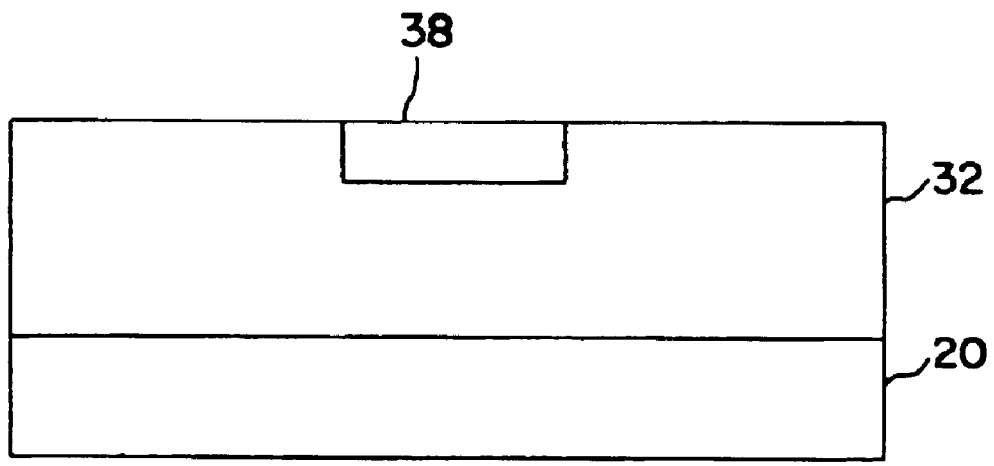
FIG. 4B is a side elevation view of the heterostructure illustrated in FIG. 3A with a device fabricated thereon.
Figure 4C:
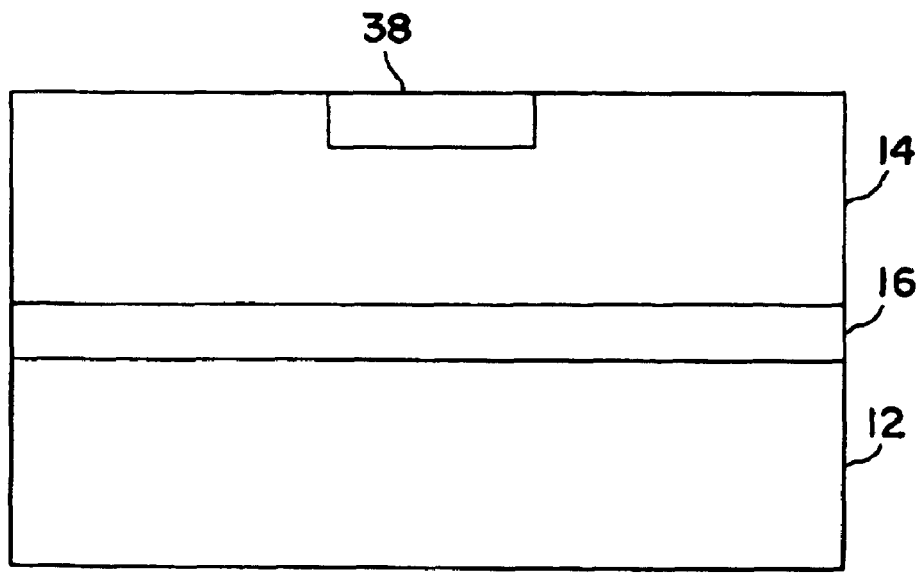
FIG. 4C is a side elevation view of the heterostructure illustrated in FIG. 1 with a device fabricated thereon.
Figure 4D:
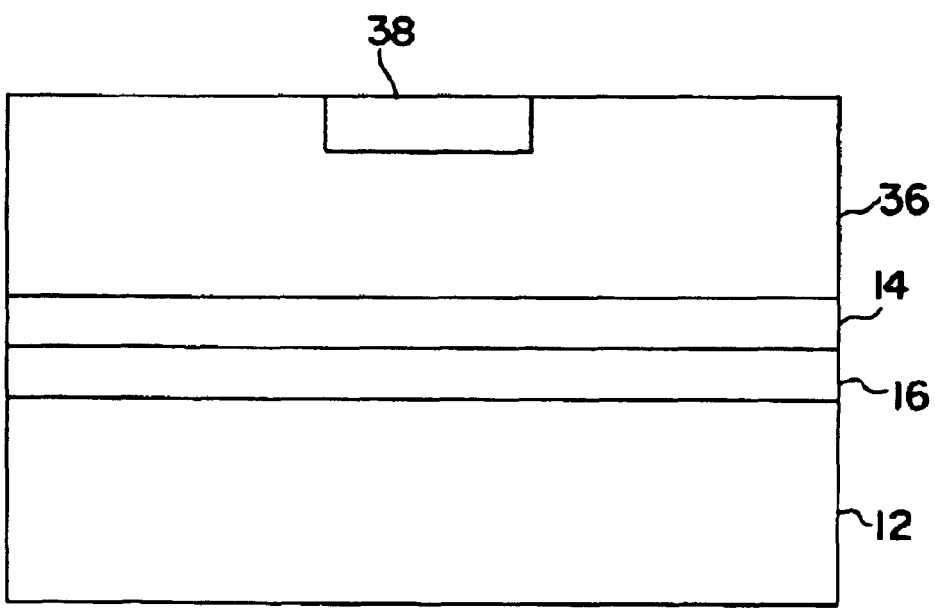
FIG. 4D is a side elevation view of the heterostructure illustrated in FIG. 3B with a device fabricated thereon.

Referring to FIG. 2, upon completion of the substrate removal process, a bulk, free-standing, single-crystal $M^{III}N$ article 20 is produced. In accordance with the invention, article 20 has a diameter d of 0.5 inch or greater, a thickness t of 50 microns or greater, and a defect density of no greater than $10^9$ defects/cm$^3$. Article 20 can be doped according to known methods. In the production of alloys and compounds, the resulting composition can have greater than 50% Group III metal and nitrogen components.

In order to produce article 20 having the dimensions and properties just described, an important step in the inventive process is the technique by which the components of $M^{III}N$ layer 14 are transported to growth surface 12A of base substrate 12. According to the invention, sputtering is performed in favor of other physical vapor deposition techniques, as well as in favor of chemical vapor deposition and other vapor phase techniques. Preferably, the sputtering is accomplished by a novel non-thermionic, plasma-enhanced sputtering technique as described hereinbelow, and at a growth rate greater than 10 microns/hour.

If an interlayer 16 is to be formed on growth surface 12A, such interlayer 16 can be deposited by any number of techniques, including physical vapor deposition (such as sputtering), molecular beam epitaxy, atmospheric chemical vapor deposition, low pressure chemical vapor deposition, plasma-enhanced chemical vapor deposition, metallorganic chemical vapor deposition, evaporation, sublimation, and hydride vapor phase epitaxy. Base substrate 12 can then be separated from $M^{III}N$ layer 14 by removing interlayer 16 using a chemical etching, cleaving, laser liftoff, or other suitable removal technique.

Bulk crystal article 20 shown in FIG. 2 can be produced in the form of a wafer, in which case the thickness will be in the range of 50 microns to 1 mm. Multiple wafers can be produced either one at a time or by providing more than one base substrate 12 in the reaction chamber. As part of a further fabrication process, a major surface of the wafer can be prepared for epitaxial growth according to known methods, such as polishing, after which an epitaxial layer of suitable composition can be deposited on the prepared surface.

In addition, the method of the invention enables the production of bulk crystal article 20 in the form of a boule, in which case the diameter is at least 2 inches and the thickness is from between 1 mm to greater than 100 mm. Multiple wafers can be cut from the boule using a wafer saw, and subsequently prepared for epitaxy.

Referring to FIG. 3A, another heterostructure, generally designated 30, is illustrated according to the invention. As shown, $M^{III}N$ article 20 can serve as a seed crystal for the homoepitaxial growth of a bulk, second $M^{III}N$ layer 32 characterized by having a defect density even lower than that of $M^{III}N$ article 20. According to this method, $M^{III}N$ article 20 has a thickness of approximately 50 to 1,000 microns. As similarly described above, article 20 can be removed to produce the free-standing bulk crystal shown for example in FIG. 2, which in this embodiment corresponds to $M^{III}N$ layer 32. According to this method, $M^{III}N$ layer 32 has a thickness of approximately 0.1 to approximately 100 mm and a diameter greater than approximately 0.5 inch. Additionally, $M^{III}N$ layer 32 can be grown in wafer or boule form as described hereinabove. Wafers can be sliced from the boule as described hereinabove.

$M^{III}N$ layer 32 can be deposited on growth surface 20A of article 20 by any number of techniques, including physical vapor deposition (e.g., sputtering), molecular beam epitaxy, atmospheric chemical vapor deposition, low pressure chemical vapor deposition, plasma-enhanced chemical vapor deposition, metallorganic chemical vapor deposition, evaporation, sublimation, and hydride vapor phase epitaxy.

Referring to FIG. 3B, another heterostructure, generally designated 35, is illustrated according to the invention. As shown, $M^{III}N$ layer 14 can serve as a seed crystal for the homoepitaxial growth of a bulk, second $M^{III}N$ layer 36 characterized by having a defect density even lower than that of first $M^{III}N$ layer 14. According to this method, first $M^{III}N$ layer 14 is grown as a thin film with a thickness of approximately 10 to 10,000 nm. As described above, base substrate 12 can be removed to produce free-standing bulk crystal 20 shown in FIG. 2, which in this embodiment corresponds to $M^{III}N$ layer 36. Additionally, $M^{III}N$ layer 36 can be grown in wafer or boule form as described hereinabove. Wafers can be sliced from the boule as described hereinabove.

Second $M^{III}N$ layer 36 can be deposited on growth surface 14A by any number of techniques, including physical vapor deposition, (e.g., sputtering), molecular beam epitaxy, atmospheric chemical vapor deposition, low pressure chemical vapor deposition, plasma-enhanced chemical vapor deposition, metallorganic chemical vapor deposition, evaporation, sublimation, and hydride vapor phase epitaxy.

Referring now to FIGS. 4A–4D, $M^{III}N$ article 20 and layers 14, 32, and 36 produced according to the invention are device-quality materials that can serve as platforms for the fabrication of one or more microelectronic devices, optoelectronic devices, and/or other electronic components 38. Non-limiting examples of devices 38 include light-emitting diodes, detectors, biological or chemical sensors, filters, transistors, rectification circuitry, semiconductor lasers., bond pads, metallization elements, and interconnects.

Figure 5A:
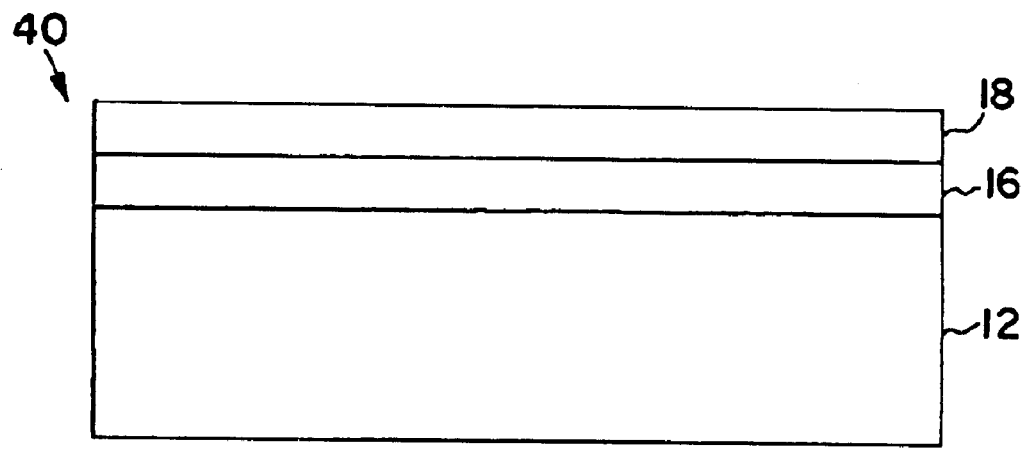
FIG. 5A is a side elevation view of a heterostructure with interlayers deposited thereon in preparation for lateral epitaxial overgrowth.
Figure 5B:
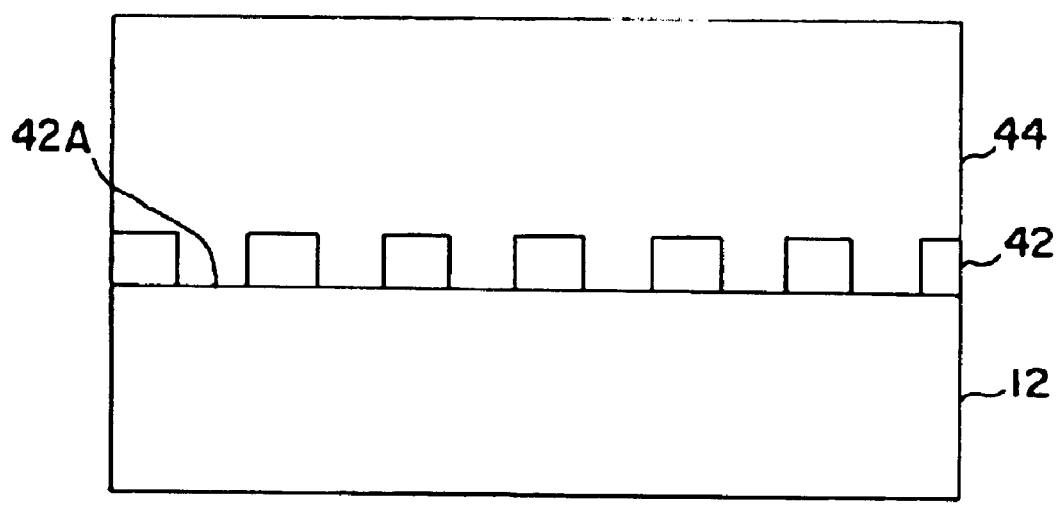
FIG. 5B is a side elevation view of the heterostructure illustrated in FIG. 5A after patterning and lateral epitaxial overgrowth procedures have been performed.

Referring to FIG. 5A, another heterostructure, generally designated 40, is illustrated according to the invention in which a lateral epitaxial overgrowth method is implemented. In this embodiment, interlayer 16 and/or an additional interlayer 18 (which can have a composition different from that of interlayer 16) is deposited on base substrate 12, and is then patterned using a conventional masking and/or etching technique to form a patterned (for example, striped) layer 42. Using the enhanced sputtering technique described herein, a reactant vapor species comprising Group III metal and nitrogen components is then transported toward patterned layer 42 and exposed portions 42A of layer 42. A device-quality, bulk single-crystal $M^{III}N$ layer 44 begins to grow upwardly from exposed portions 42A of layer 42, and then grows laterally over the tops of patterned layer 42. Upon continued growth of $M^{III}N$ layer 44, the growing crystal coalesces to form a continuous, low-defect density layer.

Referring now to FIG. 6, the non-thermionic, plasma-enhanced sputtering technique described hereinbelow can be utilized to produce an infrared and/or microwave-transparent, bulk-form, Group III nitride window, generally designated 50, which is characterized by a high purity and a highly oriented polycrystalline morphology. Window 50 generally includes a bulk Group III nitride (such as aluminum nitride or gallium nitride) window material 52 supported in a metallic frame 54. Window material 52 has properties approaching theoretical bulk values, including a thermal conductivity of 320 W/m*K in the case of aluminum nitride. Because of its high thermal conductivity, window material 52 is resistant to thermal shock. Moreover, a thickness of greater than approximately 50 $\mu$m is possible. The transparency of window material 52 is greater than approximately 65%.

As illustrated in FIG. 6, window material 52 includes an outer elongate surface 52A and an inner elongate surface 52B. A plurality of grain boundaries 52C are oriented substantially normal to elongate surfaces 52A and 52B. Thus, window material 52 will readily conduct heat energy H through its thickness in the direction generally normal to elongate surfaces 52A and 52B (that is, generally along grain boundaries 52C). Heat energy H is impeded, however, in directions generally parallel to elongate surfaces 52A and 52B. In use, heat energy H can be carried away from inner elongate surface 52B by supplying a heat transfer medium G, such as hydrogen or helium, proximate or adjacent to inner elongate surface 52B. An advantage of the production of window 50 according to methods of the present invention is that window material 52 can be directly bonded to a metallic frame 54 as an inherent step of the growth process. Metallic frame 54 can be provided in a number of different shapes and cross-sectional profiles, and can be employed as a structural support for window material 52 in a subsequent installation procedure. An initial substrate may be provided on which window material 52 grows, and thereafter removed by etching or other known removal processes.

Window 50 has several useful applications, including microwave windows for high-power radars, infrared windows for high-speed heat-seeking missiles, windows for optical monitors in high-temperature manufacturing processes, windows for optical sensors in turbine engines and in power plants, materials for electronic substrates, and heat-spreading components in high-power electronic devices. Bulk-form aluminum nitride or gallium nitride available from other sources (such as by sintering and other ceramic powder processing techniques) does not meet the requirements for IR and microwave-transparent windows, largely due to the contaminates present in the bulk as a result of conventional manufacturing techniques. For example, ceramic powder processing techniques require oxide binders which clog the grain boundaries and consequently reduce infrared and microwave transmission.

In the embodiments of the invention described hereinabove, at least one $M^{III}N$ layer is epitaxially grown by a high-growth rate sputtering technique. The sputtering process is accomplished by either conventional techniques or, in a preferred process, by implementing a novel enhanced sputtering technique described hereinbelow.

A conventional sputtering technique utilizes a parallel-plate, planar diode configuration in which a cathode and an anode spaced apart from each other in a sealable reaction chamber by an electrode gap. The cathode is driven negative by a power supply. A glow-discharge plasma is generated between the two electrodes and confined by a grounded metal vacuum containment wall of the reaction chamber. To "strike" (initiate) the discharge, it is often necessary to supply a spike of higher voltage, or to adjust pressure to a minimum so that the gas will break down at the voltage available. The voltage drop across the sheath of the plasma results in high-energy ion bombardment of the cathode by positive ions and sputtering of the cathode. The cathode voltage drop also sustains the plasma by accelerating secondary electrons emitted from the cathode into the plasma where they initiate a cascade of ionizing collisions. The diode can be operated under an applied DC voltage or an RF voltage. RF excitation is required when sputtering insulating targets.

A mode of plasma-enhanced chemical activation generally known as "reactive sputtering" uses a sputtered source material along with a gaseous one. The gas becomes dissociated in the sputtering plasma and reacts to form a compound film. The parallel-plate plasma configuration can be used to supply vapor for film deposition by sputter-erosion of the cathode, which serves as the target material. Often, the plasma is magnetized using a magnetron assembly. A reactive gas (e.g., $N_2$) is added to the sputtering plasma (e.g., argon gas plasma) in order to shift compound-film stoichiometry in sputtering from a compound target, or to deposit a compound film from a metallic target (e.g., Al). Compound deposition by reactive sputtering from a metallic target generally lowers target fabrication costs and increases target purity as compared to using a compound target, although process control can be more difficult if film composition is critical.

When employing a planar-diode plasma configuration to cause sputtering, the beam electrons ejected from the cathode must undergo enough ionizing collisions with the gas to sustain plasma before the beam electrons reach the anode and are removed there. This requirement places a lower limit on operating pressure, and can be enhanced through the use of a magnetron assembly. The magnetron assembly typically includes a central bar magnet and an outer ring magnet or magnets of opposite pole. The magnetron produces a crosswise magnetic field over the cathode. The magnetic field traps the beam electrons in orbits near the cathode surface. As a result, the path lengths of the beam electrons are significantly increased before the electrons finally escape to the anode by collisional scattering. Because the paths of the electrons become longer than the electrode gap, the minimum pressure needed to sustain the plasma is much lower (typically 0.1 Pa rather than 3 Pa) when using a magnetron as compared with a planar diode without a magnetron. At a lower pressure (e.g., 0.1 Pa), the sputtered particles retain most of their kinetic energy upon reaching the substrate, and this energy has advantageous effects on the structure of the depositing film. In addition, deposition rate is increased due to reduced scattering and redeposition of sputtered particles on the cathode. Moreover, the beam electrons are utilized more efficiently, with the result that a lower applied voltage (e.g., approximately 500 V) is required to sustain a plasma of a given density, and the voltage increases less steeply with power input as compared to a non-magnetron planar diode configuration.

A typical magnetron has a planar, circular configuration. The target material of the cathode is a disc, typically 3–10 mm thick, and is bonded (such as by soldering, for good thermal contact) to a water-cooled copper backing plate. The water coolant can be deionized to prevent electrolytic corrosion between the electrically-biased backing plate and a grounded water supply. The cathode is often floated off ground with a ceramic insulating ring. The containment wall of the reaction chamber serves as an anode, although grounded shields can be added to confine the sputtered material. The crosswise magnetic field is established by the magnets. The magnets are connected on the back by an iron "field-return" plate to complete the magnetic circuit and to confine the magnetic field.

Upon igniting plasma, beam electrons emitted from the cathode are accelerated into plasma by the electric field of the cathode sheath. The presence of the magnetic field causes the beam electrons to curve into orbits as a result of the Lorentz force, $F=F_E+F_B=q_eE+q_ev\ x_B$. The radius of the orbit (referred to as the gyratron, cyclotron or Larmor radius) depends on the strength of the magnetic field and on the electron velocity component perpendicular to the magnetic field. In order for the magnetic field to have an effect on the beam electrons, the pressure must be low enough (typically less than a few Pa) that the electron mean free path is not significantly less than the orbit radius. If this condition is met, the beam electrons are said to be "magnetized" although the ions are not magnetized. The magnetron can operate as a sputtering source at much higher pressures, but in such cases gas scattering dominates the behavior of the beam electrons instead of the magnetic field itself.

Under lower pressure conditions, the beam electrons emitted from the target surface of the cathode or created by ionization in the sheath field are accelerated vertically by the electric field and simultaneously forced sideways by the magnetic field. The beam electrons eventually reverse direction and return toward the target. As the beam electrons are thus directed toward the target, they decelerate in the electric field until their direction is again reversed, and the cycle repeats. The net motion or path of these electrons is a circular drift path around the circle of the target. This drift path is in the direction of the E×B vector product. The magnetron is ordinarily designed such that the E×B drift path closes on itself so that the beam electrons do not pile up or accumulate at some location.

Preferably, the plasma generated in the reaction chamber is enhanced by taking advantage of the "hollow cathode" effect, a phenomenon which generally involves utilizing geometric means to trap secondary electrons emitted from an ion-bombarded target cathode. When a hollow-cathode-type structure is driven to a very high discharge current, its cathode surfaces heat to a temperature sufficient to cause thermionic emission of electrons, and the local plasma glow discharge will enter the arc mode. A hollow cathode, typically constructed of a refractory material and provided with a local gas supply, can be a useful source of moderately energetic electrons for plasmas. The hollow cathode is provided in the form of a tube having a tantalum tip. A gas source is connected to one end of the hollow cathode, and a small aperture or orifice is provided at the tip. The aperture restricts the gas flow and results in a large pressure differential across tip. The inner pressure of the hollow cathode is typically in the range of several hundred mTorr. Electrons are emitted by biasing the hollow cathode negatively with respect to the local plasma potential (which is usually the ground potential). A hollow cathode having a diameter of only a few millimeters can be employed to produce an electron current of several to ten amperes. An external heater or a short-term, high-voltage spike is typically used to heat the hollow cathode to the temperature required for emission.

The hollow cathode is situated in the fringe region of the magnetic field of the magnetron to supply additional electrons to the magnetron discharge. The hollow cathode serves to decouple the current-voltage relation of the diode plasma and allow operation of the plasma at wide ranges of voltage and current, as well as to lower the operating pressure in chamber. The hollow cathode can operate at 0.1 mTorr, which is below the range of the more conventional magnetron/diode arrangement described hereinabove. If conventional magnetron/diode arrangements were to operate at these lower pressures, there would be not be enough gas atoms for efficient ionization by the secondary electrons. The additional supply of electrons from the hollow cathode, however, removes this limitation and allows operation at approximately 0.1 mTorr for magnetron arrangements, and approximately 0.5 mTorr for RF-diode arrangements. Such pressures are well into the long mean free path mode, and sputtered atoms or ions move in straight, line-of-sight trajectories without gas scattering.

While hollow cathode enhanced sputtering devices provide advantages over other sputter deposition techniques, there are still drawbacks with regard to their use, owing to the fact that they are thermionic emitting electron devices. For instance, contamination is still observed to be a problem, particularly since the hollow cathode tip material tends to evaporate and mix with the growing deposition material. Another problem relates to the intense heat produced by thermionic emission, which can damage the growing material. Therefore, in accordance with a preferred embodiment of the present invention, a novel sputter transport device is provided that is characterized by the use of a non-thermionic electron/plasma injector assembly.

Figure 7:
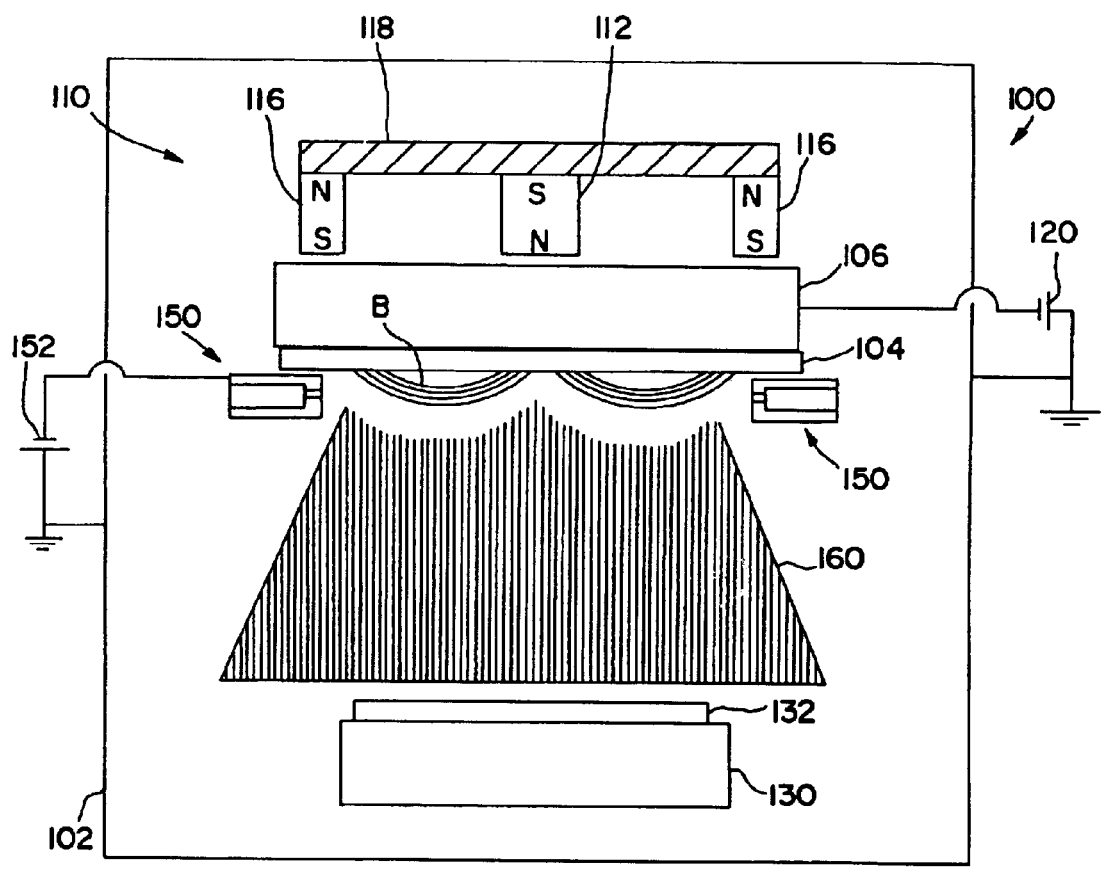
FIG. 7 is a schematic view of a novel sputter transport device according to one embodiment of the present invention.

Referring now to FIG. 7, a non-thermionic sputter transport device, generally designated 100, is illustrated. Key operating components of transport device 100 are contained within a grounded, sealable sputter-transport chamber 102. As will be appreciated by persons skilled in the art, a pumping system (not shown) is provided to control the pressure (vacuum or otherwise) within chamber 102. Supply systems (not shown) are also provided for delivering a background gas (e.g., argon), and a reactive gas (e.g., nitrogen) in the case of reactive sputtering, into chamber 102. In some applications of the present invention, the reactive gas may also serve as the background gas.

A cathode 104 constructed from a metallic, dielectric, or compound target material is bonded to a target holder 106 to establish thermal contact therebetween. Target cathode 104 may be provided in the form of a circular disk or a rectilinear plate, or may have some other shape. Target holder 106 is preferably constructed of copper or other relatively inexpensive material that offers acceptable levels of both thermal and electrical conductivity. A heat exchanger system (not shown) is provided to circulate a heat transfer medium such as water through target holder 106 to keep target holder 106 (and thus target cathode 104) cool. A magnetron assembly 110 includes a set of oppositely-poled magnets 112 and 116 connected by a magnetic field return plate 118. The arrangement of magnets 112 and 116 preferably constitutes a central magnetic bar 112 surrounded by an outer magnetic annulus 116, although other arrangements and shapes could be provided. Magnets 112 and 116 are preferably located on the side of target holder 106 opposite to target cathode 104. A negative bias voltage is applied to target holder 106 by connecting target holder 106 in series with a voltage source 120.

A substrate holder 130, which serves as the primary anode, is disposed in chamber 102 in parallel with and spaced at a distance from target cathode 104. Preferably the spacing is in the range of approximately 2 cm to 20 cm. Substrate holder 130 can be constructed from any material that is either electrically conductive or isolated, and can be provided as either a cooling structure or a heating structure. It is preferable that transport device 100 be oriented such that target cathode 104 is physically situated opposite to substrate holder 130, but can be either vertically above or below substrate holder 130. A substrate 132 is disposed on substrate holder 130. Depending on the specific application of transport device 100, substrate 132 can be either initially provided in bulk form on which a thin-film is to be deposited, or it represents the growing bulk material grown through use of transport device 100.

As will be appreciated by persons skilled in the art, substrate holder 130 or an associated transfer arm (not shown) can be used to transport substrate holder 130 and, if applicable, an initially-provided substrate material into and out from chamber 102. In addition, a load lock or similar component (not shown) can be provided to serve as an interface between chamber 102 and the ambient environment to assist in maintaining reduced pressure in chamber 102 when substrate holder 130 and/or an initially-provided substrate material is loaded and thereafter removed from chamber 102. Other known processing components can used as appropriate to assist in implementing the methods of the invention involving the use of transport device 100, including an electronic control system, a power supply system, a pressure monitoring system, a mass flow control system, a temperature monitoring system, and a system for automated tracking and transport of workpieces.

As one key aspect of the present invention, an injector assembly generally designated 150 is disposed in chamber 102 proximate to target cathode 104, and is separately, negatively biased through its serial connection with a voltage source 152. Hence, injector assembly 150 serves as a cathode apart from and additional to target cathode 104, such that transport device 100 can be characterized as being a triode sputtering source.

Referring to FIGS. 8A and 8B, injector assembly 150 includes a plurality of injectors 152 serving essentially as individual hollow cathodes. Each injector 152 terminates in an inlet orifice 152A communicating with the interior of chamber 102 in the region proximate to the surface of target cathode 104. In the present embodiment, injector assembly 150 takes the form of an injector ring such that each inlet orifice 152A faces radially inwardly with respect to chamber 102, although individual injectors 152 can be arranged in a linear or other suitable configuration.

In operation, electrons in the form of supplemental or auxiliary plasma beams are non-thermionically emitted from injectors 152 as a result of the increase in electric field strength at these points, such that the electrons are subsequently injected and coupled into the gradient of the magnetic field (represented by virtual field lines B) established by magnetron source 110 to generate an intense plasma. Injector assembly 150 may thus be characterized as a cool, non-thermionic electron/plasma source which injects an approximately equal number of ions and electrons into the region illustrated in FIG. 7 proximate to target cathode 104, thereby creating a higher probability of ionization of the target material. An increase in magnetron current is observed due to the added electrons from injector assembly 150. This effect can be seen as a significant increase in the plasma brightness, as well as a significant increase in the sputter deposition rate. The intense plasma created in the proximity of the surface of target cathode 104 results in the significant increase in deposition rate by more than ten times over conventional techniques. Injector assembly 150 also serves to electrostatically confine the plasma to form a broad plasma beam 160 directed toward substrate 132. Due to the bulk mass and/or cooling design of injector assembly 150, its temperature remains low and accordingly no thermionic emission, evaporation or contamination takes place during deposition.

Transport device 100 can be operated in either continuous DC, pulsed DC, AC or RF mode, which enables transport device 100 to reactively sputter a wide range of both conductive and insulating materials at very high rates. Due to the high percentage of gas ionization, the material of target cathode 104 is sputtered at ultra-high rates sufficient to prevent a detrimental insulating layer from forming on the target surface. In addition, due to the very high ion energies associated with the process according to the present invention, large amounts of material can be sputtered. Device 100 has been proven to operate successfully in 100% reactive gas environments, therefore demonstrating the stability of the device under very reactive conditions.

As described above, a negative bias is applied to target holder 106, which generates a magnetron sputtering discharge, and a separate negative bias is applied to injector assembly 150. This generates a very intense plasma, with beamlets of plasma emitting from each injector 152 of injector assembly 150. The added plasma density and ionization percentage in the region of the target cathode 104 increase the amount of target bombardment, thereby causing increased sputter rates. Due to the increased utilization of sputtering gas, the background processing pressure can be lowered from, for example, approximately 5 mTorr to approximately 0.1 mTorr, which can improve the microstructural properties of materials being formed. This pressure decrease increases the mean free path of molecules, enabling the creation of plasma beam 160 between target cathode 104 and substrate holder 130 (i.e., the anode) which is characterized by very high ionization efficiency and achievement of ultra-high sputter transport rates.

Figure 9:
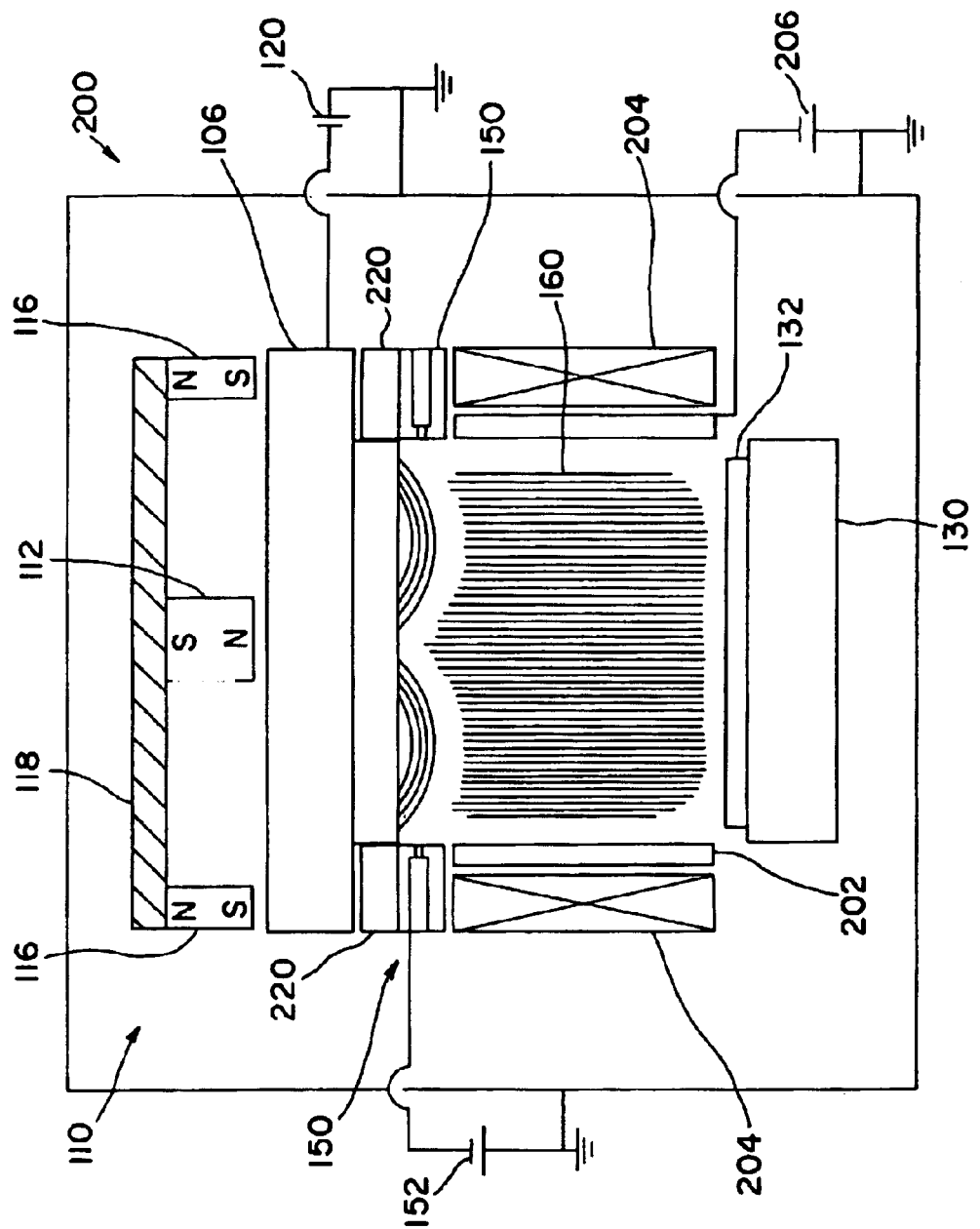
FIG. 9 is a schematic view of a novel sputter transport device according to a further embodiment of the present invention.
Figure 10:
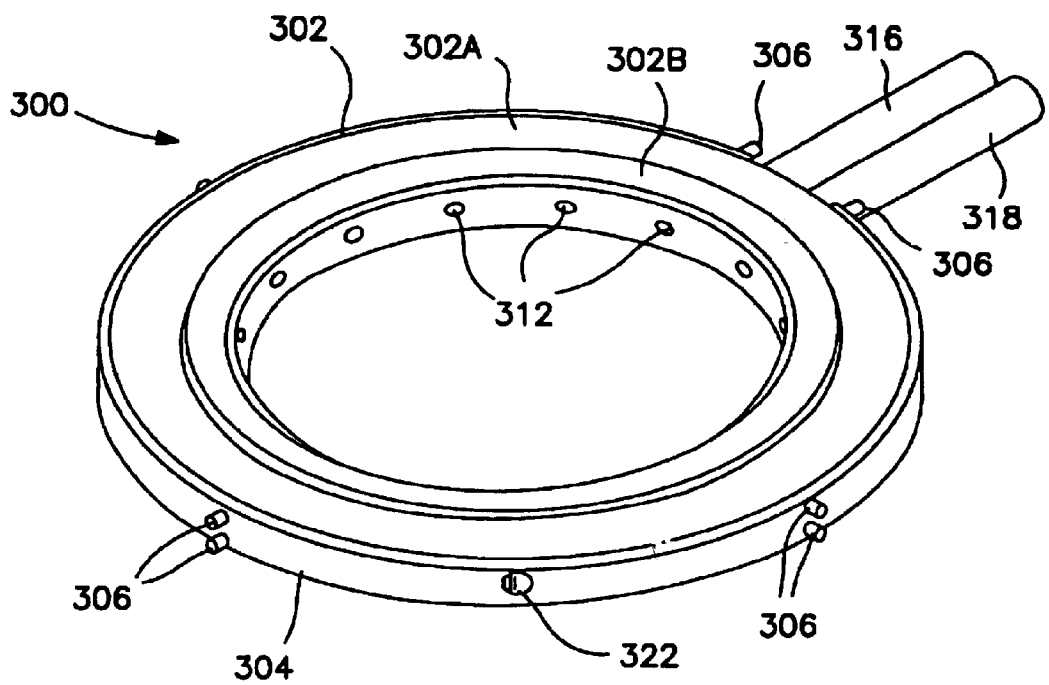
FIG. 10 is a perspective view of an electron/plasma injector assembly according to another embodiment of the present invention.
Figure 11:
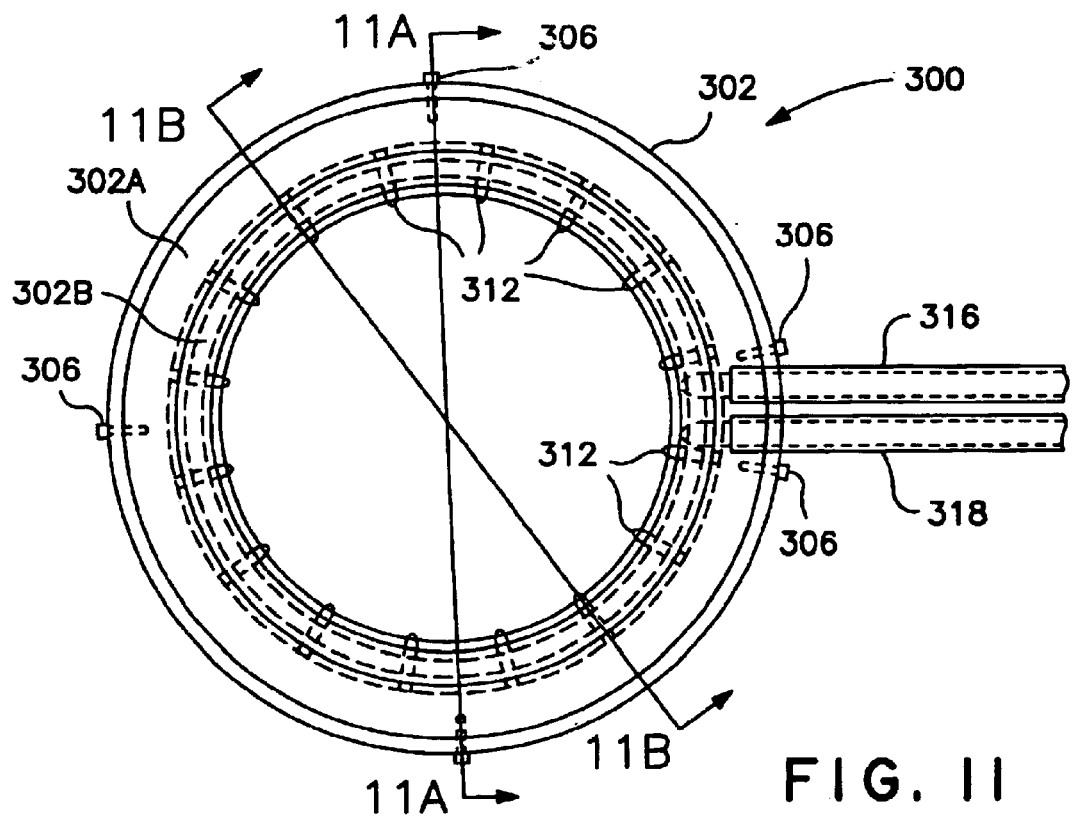
FIG. 11 is a top plan schematic view of the injector assembly illustrated in FIG. 10.
Figure 12A:
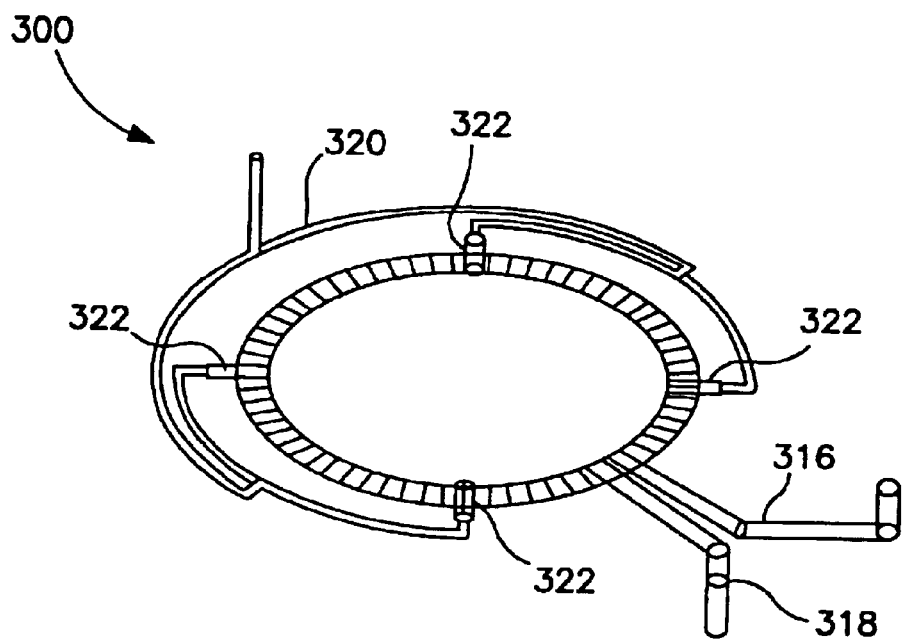
FIG. 12A is another perspective view of the injector assembly illustrated in FIG. 10.
Figure 12B:
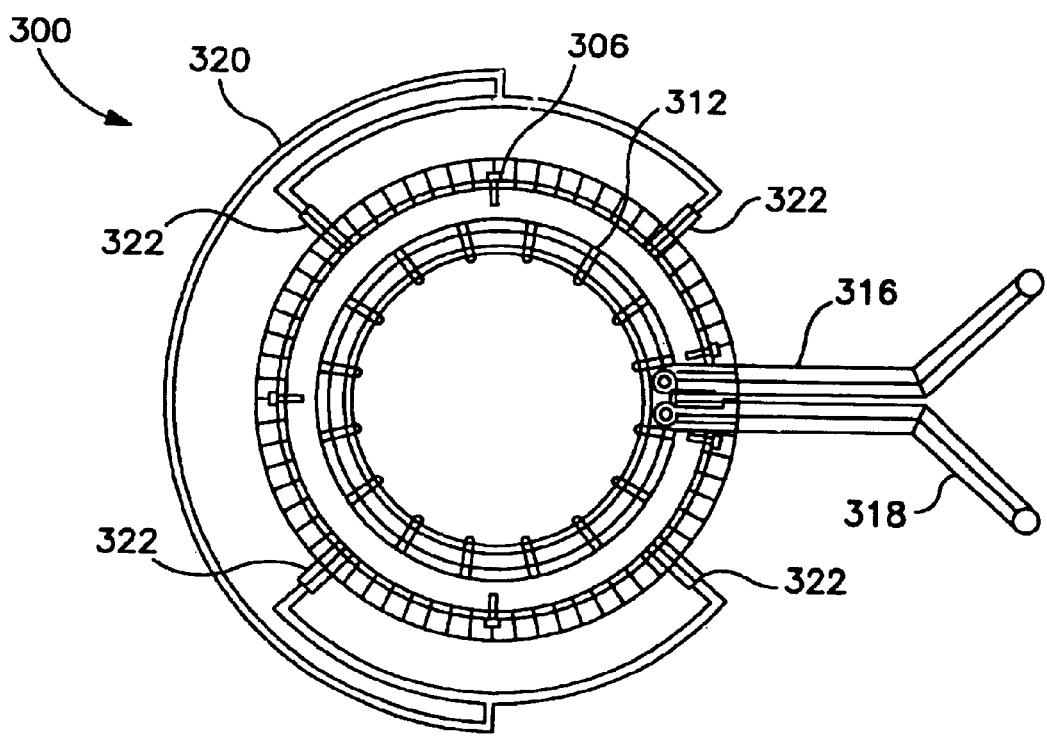
FIG. 12B is a top plan view of the injector assembly illustrated in FIG. 10.

Referring to FIG. 9, a sputter transport device, generally designated 200, is illustrated according to another embodiment of the present invention. In this particular embodiment, a biased containment shield 202, constructed from aluminum or other conductive material, is disposed in chamber 102 between target cathode 104 and substrate holder 130 and is surrounded by a containment magnet or magnets 204. A high voltage applied to containment shield 202 from a voltage source 206 acts to focus the sputtered material and plasma beam 160 onto the growing substrate 132, thereby increasing the transport efficiency of the sputtered material (such as aluminum nitride) to substrate 132. Ions and electrons become trapped within the containment region under the influence of the electric and magnetic fields and subsequently deposit on substrate 132.

Under some circumstances, the user of transport device 100 or 200 might find that the heating of injector assembly 150 causes low-melting-point metals to melt. This problem can be overcome by cooling injector assembly 150 with a copper cooling ring 220, which is also illustrated in FIG. 9.

Figure 13:
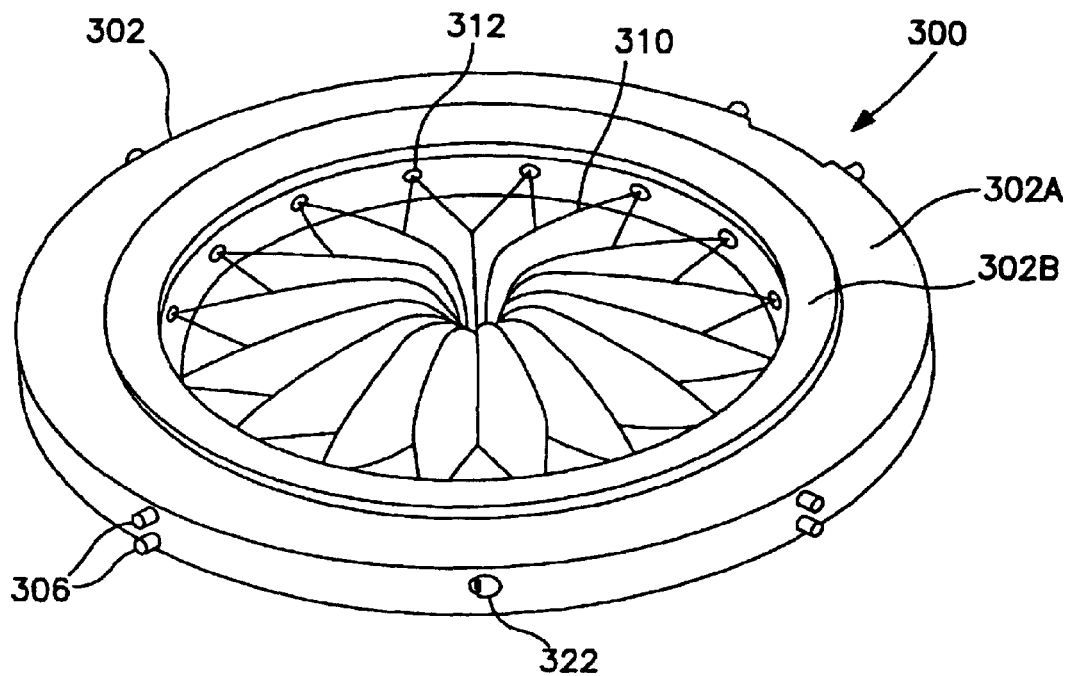
FIG. 13 is a perspective view of the injector assembly illustrated in FIG. 10 showing the operation thereof and an exemplary electron/plasma injection pattern.

Referring to FIGS. 10–13, a preferred embodiment of a fluid-cooled, ring-shaped injector assembly generally designated 300 is illustrated. Injector assembly 300 includes a main body 302 and an outer collar 304 removably secured by clamping screws 306. Main body 302 includes a process gas section 302A and a cooling section 302B. As best shown in FIGS. 11A and 11B, process gas section 302A and outer collar 304 together define a process gas chamber 308. Individual injectors for supplying electrons and cool plasma, indicated by the reference numeral 310, are defined by interchangeable gas nozzles 312 fluidly communicating with process gas chamber 308 at one end and with sputter-transport chamber 102 at the other end. Gas nozzles 312 may or may not be constructed from the same material as target cathode 104 and/or containment shield 202. Cooling section 302B of main body 302 defines a cooling reservoir 314 adapted to circulate a heat transfer fluid such as water in close proximity to each gas nozzle 312. The heat transfer fluid is circulated through cooling reservoir 314 by means of a heat transfer fluid inlet conduit 316 and outlet conduit 318. Process gas such as diatomic nitrogen or argon is supplied to injector assembly 300 by means of a process gas conduit system 320 that communicates with one or more process gas inlets 322 on main body 302. FIG. 13 illustrates one example of an emission pattern of plasma/electrons 310 obtainable by injector assembly 300. The pattern as well as the gas nozzle pressure can be altered by blocking one or more of individual gas nozzles 312.

Traditionally, sputter-deposited films have been plagued with low reactive sputter rates, excessive stress, and poor crystalline growth. Due to the non-contaminating nature of transport device 100 or 200, however, the hollow cathode effect can be advantageously utilized to produce both single-crystal and highly-oriented polycrystalline, bulk-form substrates, such as those described hereinabove, at lower pressures, ultra-high deposition rates, and with minimal material stress. Transport device 100 or 200 is also capable of growing epitaxial layers on substrates. Examples of deposited materials include binary, tertiary, and quaternary Group III nitride based compounds such as aluminum nitride, gallium nitride, indium nitride, aluminum gallium nitride, indium gallium nitride and aluminum indium gallium nitride, and alloys thereof. Suitable dopants can be added during the growth process. Both single-crystal and polycrystalline morphologies are obtainable. In one specific example, transport device 100 or 200 is capable of growing aluminum nitride purer than that made by powder processing methods and faster than CVD methods. Moreover, because transport device 100 or 200 exhibits a very high degree of sputter particle ionization, transport device 100 or 200 produces a plasma beam environment that facilitates the synthesis of nitride based materials. The material grown by transport device 100 or 200 exhibits the bulk properties of nitrides due to the resulting high crystallinity and purity. In particular, bulk aluminum nitride produced from transport device 100 or 200 has a high IR and UV transmittance, a high thermal conductivity, and a high degree of c-axis orientation.

In addition to growing the materials described hereinabove, transport device 100 or 200 can be utilized to grow a variety of ceramic thin films such as aluminum oxide and zinc oxide, or to deposit copper or other metallic interconnects onto patterned electronic devices. The high transport rate also enables the high-throughput coating of objects.

Figure 14:
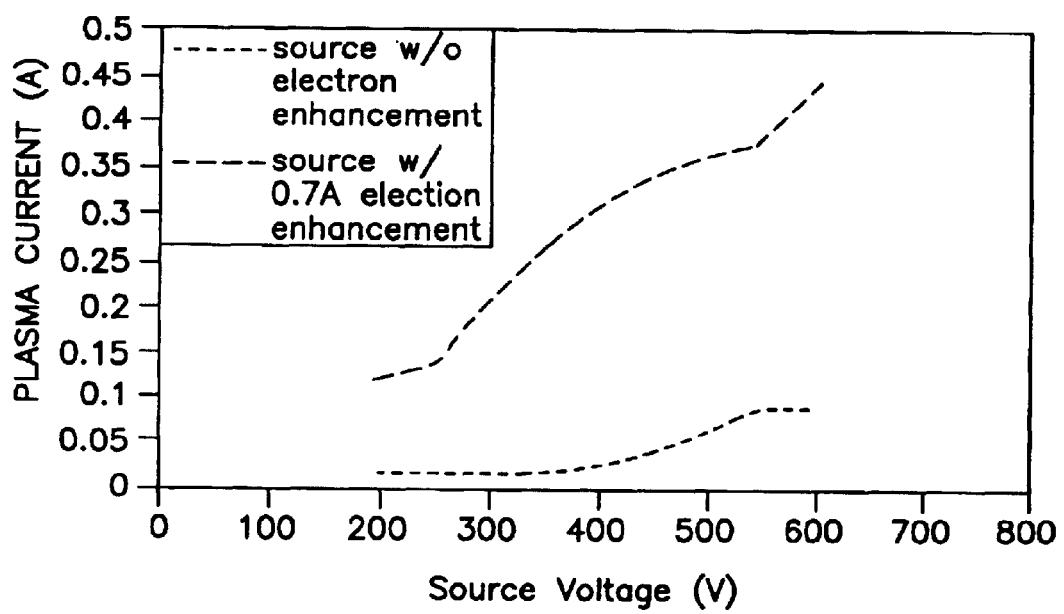
FIG. 14 is a plot comparing the source performance of a transport device provided according to the present invention and that of a conventional magnetron source.

FIG. 14 demonstrates the dramatic improvement in deposition rate by plotting plasma current as a function of applied source voltage with transport device 100 operating under a 0.7A electron enhancement (i.e., with the inventive injector ring installed and supplying current from hollow cathode-type structures), as compared to a typical magnetron sputtering device without any electron enhancement.

Figure 15:
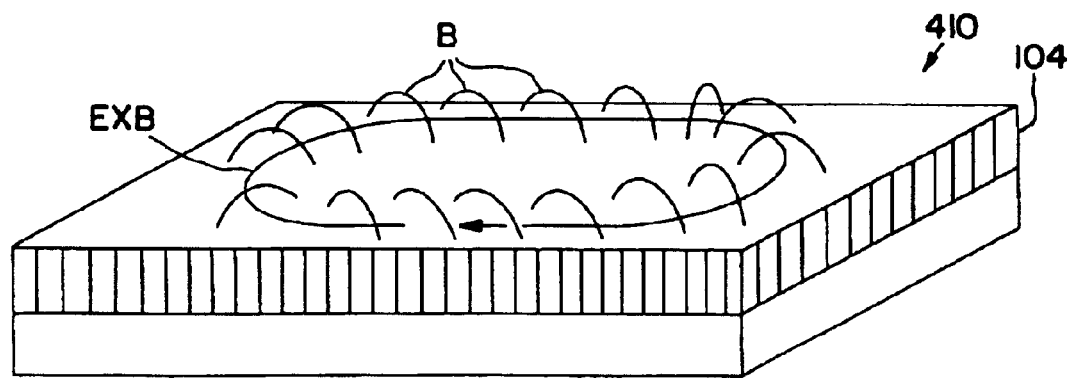
FIG. 15 is a perspective view of a rectangular magnetron source which can be employed in combination with the present invention.

Conventional planar magnetron designs suffer from poor target-material utilization because of a trenched erosion pattern that tends to form on the surface of the target material in the vicinity of the E×B drift path of the beam electrons. The radial narrowness of this trench results from radial compression of the plasma, which is in turn caused by the well-known "magnetic-mirror" effect. The electrons of the plasma are forced away from both small and large magnetron radii at the sites where the magnetic field converges toward the magnetic pole pieces. The electrons are compressed by these mirrors toward an intermediate radius where the magnetic field is uniform. Both the plasma and the ion bombardment are most intense in the region of magnetic field uniformity. The magnetic-mirror effect can be reduced somewhat by designing a flatter magnetic field or by mechanically scanning the magnets back and forth during sputtering. The non-uniformity of film thickness resulting from plasma compression can be avoided by moving the substrates around during deposition. One simpler, geometric approach to improving uniformity is illustrated in FIG. 15, wherein a rectangular magnetron generally designated 410 is utilized. With the rectangular geometry, the many of magnetic field lines B are situated along linear directions, and the beam electrons follow an oblong or "racetrack" E×B drift path at target cathode 104. The rectangular magnetron shape can be employed in connection with the present invention if non-uniformity becomes problematic.

Localization of the plasma over target cathode 104 by the transverse magnetic field of magnetron assembly 110 results in a much lower plasma density over the substrate 132 than in the case of the non-magnetron planar diode, and ion bombardment flux to substrate 132 is reduced accordingly. This is desirable when the neutral sputtered particles alone carry sufficient kinetic energy to optimize film structure, or when it is important that the substrate heating that results from ion bombardment be kept to a minimum. In other cases, however, it might be desirable to further increase film bombardment while retaining the low operating pressure of the transport device 100 or 200. One method for increasing ion bombardment of the growing film is to "unbalance" the magnets of magnetron assembly 110, such as by downsizing central magnet 112 such that the central magnet 112 cannot pull in all the field lines emanating from outer magnets 116. Hence, in the unbalanced configuration, the magnetic field lines that are not pulled into central magnet 112 will curve away toward substrate holder 130. Because electrons traveling parallel to a magnetic field are not influenced by the magnetic field, they can escape along these wayward field lines and travel toward substrate 132. The escaping electrons pull positive ions along with them by ambipolar diffusion and hence increase ion-bombardment flux to substrate 132. In addition, the bombardment energy can be increased by negatively biasing substrate 132.

Another way to increase ion-bombardment flux to the growing film is to provide an RF-powered coil to ionize the mostly neutral sputtered-particle flux during transport to substrate 132. The coil operates by coupling energy inductively into a secondary plasma downstream of the magnetron plasma.

Figure 16:
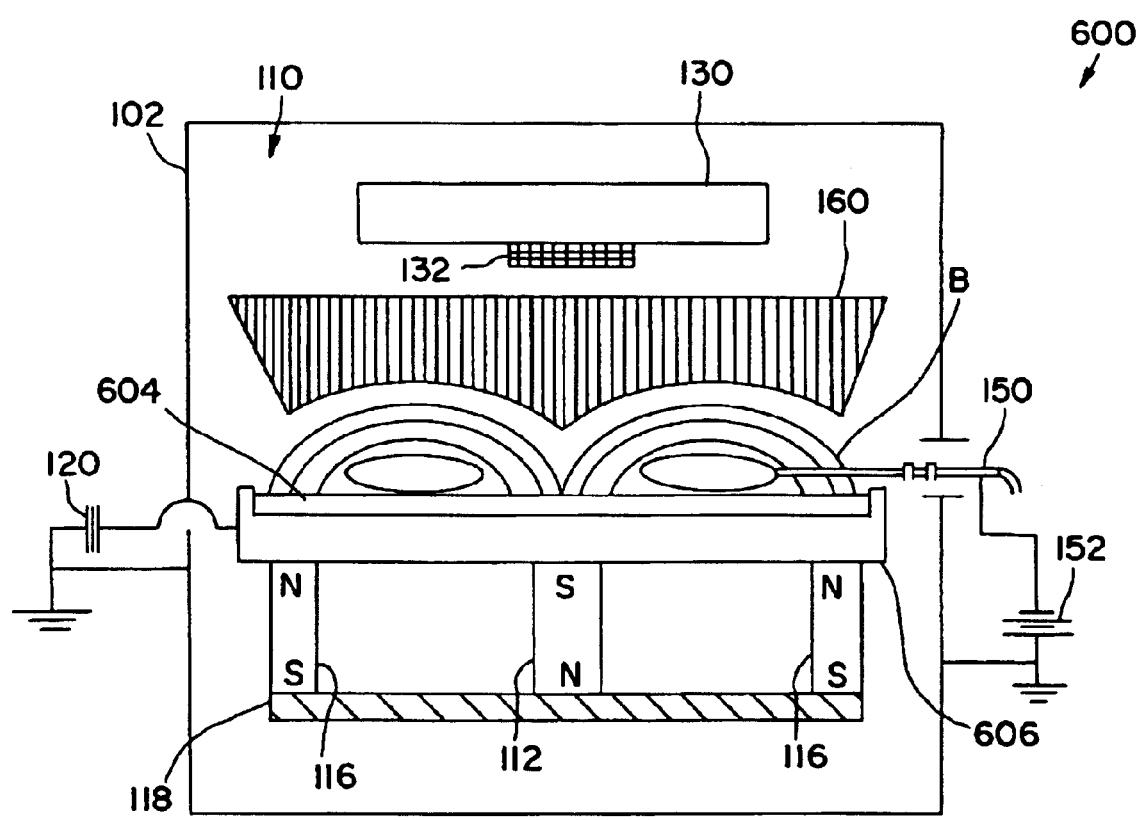
FIG. 16 is a schematic view of a novel sputter transport device according to an additional embodiment of the present invention.

Referring now to FIG. 16, a sputter transport device, generally designated 600, is illustrated according to an additional embodiment of the present invention. Many of the components of sputter transport device are similar to those of sputter transport device 100 shown in FIG. 7. In particular injector assembly 150 as described above is utilized to enhance the material transport process. A primary difference is that a liquid target 604 such as liquid-phase aluminum or gallium is provided as a source species. The target holder in this embodiment is provided in the form of a cup 606 to contain the liquid target material. Preferably, this target holder should be constructed from a material suitable for withstanding the heat involved and which will not contaminate the target material. Candidate materials for target holder 606 include molybdenum and stainless steel. In one embodiment, a 6" diameter molybdenum liquid gallium or aluminum target holder 606 is employed to prevent reaction of the holder with a high purity (99.9999%) liquid gallium or aluminum source 604. In order to obtain a flat uniform liquid surface of the gallium or aluminum, sufficient wetting of the gallium or aluminum to the molybdenum holder 606 must occur. To this end, grooves can be cut into the bottom of target holder 606 to increase its surface area and thereby increase its wettability. In addition, a breathing hole connecting the grooves can be provided to eliminate any gas trapped under the liquid gallium or aluminum.

Figure 17:
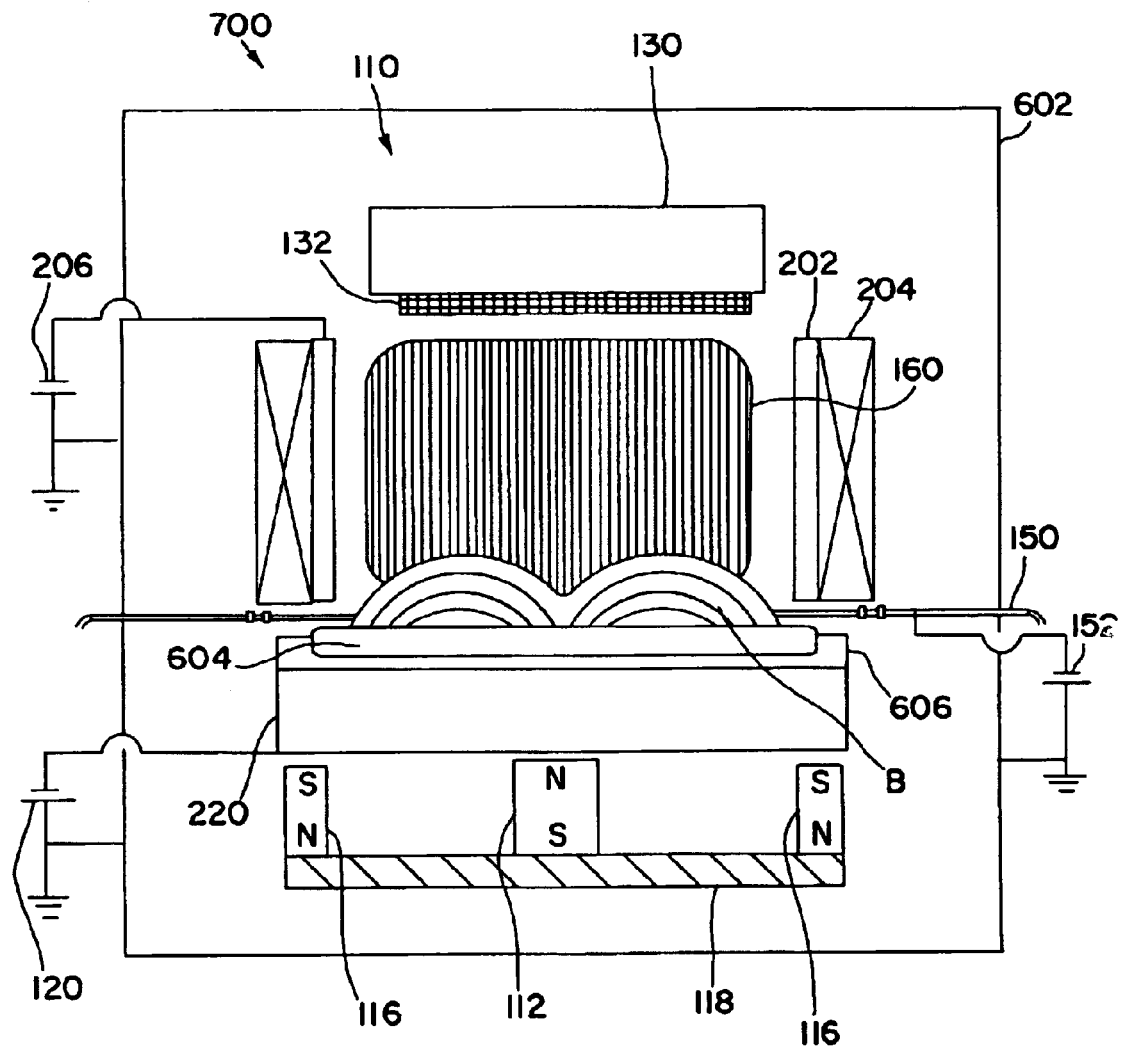
FIG. 17 is a schematic view of a novel sputter transport device according to a yet another embodiment of the present invention.

Referring now to FIG. 17, a sputter transport device, generally designated 700, is illustrated according to another embodiment of the present invention. Sputter transport device 700 is equipped with a biased containment shield 202 and containment magnets 204, similar to those described in reference to FIG. 9. A high voltage applied to containment shield 202 will focus the sputtered material onto growing substrate or film 132, thereby increasing the transport efficiency of Ga or Al to substrate or film 132.

Sputter transport devices 600 and 700 operate as described above. Gallium (or aluminum) particles sputtered from the cathode react with atomic nitrogen in the cathode magnetic fields. The gallium nitride (or aluminum nitride) particles travel through the containment magnetic field to the substrate. The quality of growth material is determined by the nucleation and growth at the substrate surface.

EXAMPLE 1

An example of a method for manufacturing a GaN single crystal layer on a sapphire substrate by enhanced sputtering of gallium in a nitrogen environment will now be described. Raw materials employed in this method include 99.9999% pure gallium and nitrogen-containing gases such as nitrogen or ammonia. The gallium target used to provide the gallium source vapor is loaded on a water-cooled magnetron assembly disposed in a vacuum chamber. The nitrogen-containing gas used to provide the nitrogen source vapor is introduced into the vacuum chamber using mass flow controllers.

A sapphire wafer is cleaned and placed in a wafer platter. The wafer platter is loaded into the vacuum chamber and placed in contact with a substrate heater assembly. The vacuum chamber is then pumped down to $10^{-2}$ Torr with a mechanical vacuum pump. A diffusion pump is used to reduce the chamber pressure to $10^{-7}$ Torr. The sample is then heated to a temperature of 1000° C. in 1 hour. The chamber is baked out to a pressure of $10^{-6}$ Torr. Nitrogen and argon gas are then introduced into the vacuum chamber. The total chamber pressure is 10 mTorr, with an argon partial pressure of 2.5 mTorr and a nitrogen partial pressure of 7.5 mTorr. The plasma is ignited and set to a power of 5 kW. The system is held in this configuration for 12 hours. The plasma is then turned off and the heater is ramped to 25° C. in 5 hours. During these stages, a single-crystal GaN layer is formed on the sapphire wafer as represented by, for example, layer 14 in FIG. 1 (but disregarding the illustrated buffer layer 16). The gas flow is stopped after the crystal has cooled to room temperature. The GaN crystal is then removed from the chamber. The resulting GaN layer on the sapphire is 300 μm thick and 2 inches in diameter.

The GaN layer can then be released from the sapphire template and prepared for use as a substrate. The sapphire template is removed from the GaN layer using a known removal technique such as, for example, by using a mechanical lapping machine. The resulting GaN wafer has a thickness of approximately 200 μm and a diameter of approximately 2 inches as represented by, for example, article 20 in FIG. 2. The GaN wafer is then chemically or mechanically polished by known techniques. The polishing step is followed by a dry etching procedure to produce a surface on the GaN wafer receptive to a thin film of GaN. An epitaxial layer of GaN is then deposited on the prepared surface of the GaN wafer to a typical thickness of approximately 1 to 2 microns by an appropriate process such as, for example, sputtering, MBE, MOCVD, or HVPE. Various devices, components, and/or additional layers can then be formed on the prepared GaN substrate.

EXAMPLE 2

An example of a method for manufacturing a GaN single crystal homoepitaxial layer on a GaN buffer layer on sapphire by enhanced sputtering of gallium in a nitrogen environment will now be described. Raw materials employed in this method include 99.9999% pure gallium and nitrogen-containing gases such as nitrogen or ammonia. The gallium target used to provide the gallium source vapor is loaded on a water-cooled magnetron assembly disposed in a vacuum chamber. The nitrogen-containing gas used to provide the nitrogen source vapor is introduced into the vacuum chamber using mass flow controllers.

A sapphire wafer is cleaned and placed in a wafer platter. The wafer platter is loaded into the vacuum chamber and placed in contact with a substrate heater assembly. The vacuum chamber is then pumped down to $10^{-2}$ Torr with a mechanical vacuum pump. A diffusion pump is used to reduce the chamber pressure to $10^{-7}$ Torr. The sample is then heated to a temperature of 1000° C. in 1 hour. The chamber is baked out to a pressure of $10^{-6}$ Torr. The temperature is then reduced to 500° C. in 10 minutes. Nitrogen and argon gas are then introduced into the vacuum chamber. The total chamber pressure is 10 mTorr, with an argon partial pressure of 2.5 mTorr and a nitrogen partial pressure of 7.5 mTorr. The plasma is turned on at 500 W for 1 minute. At this point, a GaN buffer layer is formed on the sapphire wafer as represented by, for example, intermediate layer 16 in FIG. 1. The temperature is then increased to 1000° C. in 5 minutes and held for 10 minutes. The plasma is ignited again and set to a power of 5 kW. The system is held in this configuration for 12 hours. The plasma is then turned off and the heater is ramped to 25° C. in 5 hours. During these stages, a single-crystal GaN layer is formed on the buffer layer as represented by, for example, layer 14 in FIG. 1. The gas flow is stopped after the crystal has cooled to room temperature. The GaN crystal is then removed from the chamber. The resulting GaN layer on the sapphire and buffer layer is 300 μm thick and 2 inches in diameter.

The GaN layer can then be released from the sapphire template and prepared for use as a substrate. The sapphire template is removed from the GaN layer using a known technique such as, for example, by using a mechanical lapping machine. The resulting GaN wafer has a thickness of approximately 200 μm and a diameter of approximately 2 inches as represented by, for example, article 20 in FIG. 2. The GaN wafer is then chemically or mechanically polished by known techniques. The polishing step is followed by a dry etching procedure to produce a surface on the GaN wafer receptive to a thin film of GaN. An epitaxial layer of GaN is then deposited on the prepared surface of the GaN wafer to a typical thickness of approximately 1 to 2 microns by an appropriate process such as, for example, sputtering, MBE, MOCVD, of HVPE. Various devices, components, and/or additional layers can then be formed on the prepared GaN substrate.

EXAMPLE 3

Another example of a method for manufacturing a GaN single crystal layer on a sapphire substrate by enhanced sputtering of gallium in a nitrogen environment will now be described. Raw materials employed in this method include 99.9999% pure gallium and nitrogen-containing gases such as nitrogen or ammonia. The gallium target used to provide the gallium source vapor is loaded on a water-cooled magnetron assembly disposed in a vacuum chamber. The nitrogen-containing gas used to provide the nitrogen source vapor is introduced into the vacuum chamber using mass flow controllers.

A sapphire wafer is cleaned and placed in a wafer platter. The wafer platter is loaded into the vacuum chamber and placed in contact with a substrate heater assembly. The vacuum chamber is then pumped down to $10^{-2}$ Torr with a mechanical vacuum pump. A diffusion pump is used to reduce the chamber pressure to $10^{-7}$ Torr. The sample is then heated to a temperature of 1000° C. in 1 hour. The chamber is baked out to a pressure of $10^{-6}$ Torr. Argon gas is introduced into the vacuum chamber through the non-thermionic electron/plasma injector assembly described hereinabove. Nitrogen gas is introduced into the vacuum chamber near the sapphire wafer substrate. The total chamber pressure is 10 mTorr, with an argon partial pressure of 2.5 mTorr and a nitrogen partial pressure of 7.5 mTorr. The magnetron plasma is ignited and set to a power of 5 kW. The plasma supplied by the injector assembly is ignited and set to a power of 1 kW. The system is held in this configuration for 3 hours. The plasma is then turned off and the heater is ramped to 25° C. in 5 hours. During these stages, a single-crystal GaN layer is formed on the sapphire wafer as represented by, for example, layer 14 in FIG. 1 (but disregarding the illustrated buffer layer 16). The gas flow is stopped after the crystal has cooled to room temperature. The GaN crystal is then removed from the chamber. The GaN layer on the sapphire is 300 μm thick and 2 inches in diameter.

The GaN layer can then be released from the sapphire template and prepared for use as a substrate. The sapphire template is removed from the GaN layer using a known technique such as, for example, by using a mechanical lapping machine. The resulting GaN wafer has a thickness of approximately 200 μm and a diameter of approximately 2 inches as represented by, for example, article 20 in FIG. 2. The GaN wafer is then chemically or mechanically polished by known techniques. The polishing step is followed by a dry etching procedure to produce a surface on the GaN wafer receptive to a thin film of GaN. An epitaxial layer of GaN is then deposited on the prepared surface of the GaN wafer to a thickness of approximately 1 to 2 microns by an appropriate process such as, for example, sputtering, MBE, MOCVD or HVPE. Various devices, components, and/or additional layers can then be formed on the prepared GaN substrate.

EXAMPLE 4

An example of a method for manufacturing a GaN single crystal in boule form on a sapphire substrate by enhanced sputtering of gallium in a nitrogen environment will now be described. Raw materials employed in this method include 99.9999% pure gallium and nitrogen-containing gases such as nitrogen or ammonia. The gallium target used to provide the gallium source vapor is loaded on a water-cooled magnetron assembly disposed in a vacuum chamber. The nitrogen-containing gas used to provide the nitrogen source vapor is introduced into the vacuum chamber using mass flow controllers.

A sapphire wafer is cleaned and placed in a wafer platter. The wafer platter is loaded into the vacuum chamber and placed in contact with a substrate heater assembly. The vacuum chamber is then pumped down to $10^{-2}$ Torr with a mechanical vacuum pump. A diffusion pump is used to reduce the chamber pressure to $10^{-7}$ Torr. The sample is then heated to a temperature of 1000° C. in 1 hour. The chamber is baked out to a pressure of $10^{31\ 6}$ Torr. The temperature is then reduced to 500° C. in 10 minutes. Argon gas is introduced into the vacuum chamber through the non-thermionic electron/plasma injector assembly described hereinabove. Nitrogen gas is introduced into the vacuum chamber near the sapphire wafer substrate. The total chamber pressure is 10 mTorr, with an argon partial pressure of 2.5 mTorr and a nitrogen partial pressure of 7.5 mTorr. The magnetron plasma is turned on at 500 W for 1 minute. At this point, a GaN buffer layer is formed on the sapphire wafer as represented by, for example, intermediate layer 16 in FIG. 1. The temperature is then increased to 1000° C. in 5 minutes and held for 10 minutes. A voltage of 100 V is applied to the containment shield described hereinabove, and the containment magnets (also described hereinabove) are turned on. The magnetron plasma is ignited and set to a power of 10 kW. The plasma supplied by the injector assembly is ignited and set to a power of 5 kW. The system is held in this configuration for 50 hours. The plasma is then turned off and the heater is ramped to 25° C. in 5 hours. During these stages, a single-crystal GaN boule is formed on the buffer wafer as represented by, for example, layer 32 in FIG. 3. The gas flow is stopped after the crystal has cooled to room temperature. The GaN crystal boule is then removed from the chamber. The GaN boule on the sapphire is 30 mm thick and 2 inches in diameter.

One or more device-ready substrates can then be prepared from the GaN boule. The GaN boule is cut using a known technique such as, for example, by using an inside diameter wafer saw, thereby producing a GaN wafer. The wafer has a thickness of approximately 500 μm and a diameter of approximately 2 inches. The GaN wafer is then chemically or mechanically polished by known techniques. The polishing step is followed by a dry etching procedure to produce a surface on the GaN wafer receptive to a thin film of GaN. An epitaxial layer of GaN is deposited on the prepared surface of the GaN wafer to a thickness of approximately 1 to 2 microns by an appropriate process such as, for example, sputtering, MBE, MOCVD, or HVPE. Various devices, components, and/or additional layers can then be formed on the prepared GaN substrate.

It will be understood that various details of the invention may be changed without departing from the scope of the invention. Furthermore, the foregoing description is for the purpose of illustration only, and not for the purpose of limitation—the invention being defined by the claims.

What is claimed is:

1. A method for producing a single-crystal $M^{III}N$ article comprising the steps of:
   (a) providing a template material having an epitaxial-initiating growth surface;
   (b) sputtering a Group III metal target in a plasma-enhanced environment to produce a Group III metal source vapor;
   (c) combining the Group III metal source vapor with a nitrogen-containing gas to produce a reactant vapor species comprising Group III metal and nitrogen; and
   (d) depositing the reactant vapor species on the growth surface to produce a single-crystal $M^{III}N$ layer thereon having a thickness of greater than approximately 10 microns.

2. The method according to claim 1 wherein the template material comprises a component selected from the group consisting of sapphire, silicon, silicon carbide, diamond, lithium gallate, lithium aluminate, ScAlMg, zinc oxide, spinel, magnesium oxide, gallium arsenide, glass, tungsten, molybdenum, hafnium, hafnium nitride, zirconium, zirconium nitride, carbon, silicon-on-insulator, carbonized silicon-on-insulator, carbonized silicon-on-silicon, and gallium nitride.

3. The method according to claim 1 wherein the template material is selected from the group consisting of conductive substrates, insulating substrates, semi-insulating substrates, twist-bonded substrates, compliant substrates, or patterned substrates.

4. The method according to claim 1 wherein the template material has a thermal coefficient of expansion substantially equal to the $M^{III}N$ layer.

5. The method according to claim 1 wherein the template material has a diameter of approximately 0.5 inch or greater.

6. The method according to claim 1 wherein the Group III metal target comprises a component selected from the group consisting of gallium, indium, aluminum, and binary, ternary, and quaternary alloys and compounds thereof.

7. The method according to claim 1 wherein the nitrogen-containing gas includes species selected from the group consisting of diatomic nitrogen, atomic nitrogen, nitrogen ions, partially ionized nitrogen, ammonia, nitrogen-containing compounds, and combinations thereof.

8. The method according to claim 1 wherein the reactant vapor species is deposited directly on the template material.

9. The method according to claim 1 comprising the step of depositing an intermediate layer on the template material prior to depositing the reactant vapor species.

10. The method according to claim 9 wherein the intermediate layer comprises a material selected from the group consisting of GaN, AlN, InN, ZnO, SIC, and alloys thereof.

11. The method according to claim 9 wherein the intermediate layer comprises SiO2, $Si_xN_y$, diamond, lithium gallate, lithium aluminate, zinc oxide, spinel, magnesium oxide, gallium arsenide, tungsten, molybdenum, hafnium, hafnium nitride, zirconium, zirconium nitride, and carbon.

12. The method according to claim 9 wherein the intermediate layer is deposited by causing lateral epitaxial overgrowth of the intermediate layer on the growth surface.

13. The method according to claim 9 wherein the intermediate layer comprises more than one layer.

14. The method according to claim 9 wherein the intermediate layer is deposited by a technique selected from the group consisting of physical vapor deposition, sputtering, molecular beam epitaxy, atmospheric chemical vapor deposition, low pressure chemical vapor deposition, plasma-enhanced chemical vapor deposition, metalorganic chemical vapor deposition, evaporation, sublimation, and hydride vapor phase epitaxy.

15. The method according to claim 1 comprising the step of doping the $M^{III}N$ layer.

16. The method according to claim 1 wherein the $M^{III}N$ layer is formed at a growth rate of approximately 10 microns/hour or greater.

17. The method according to claim 1 wherein the $M^{II}N$ layer has a diameter of approximately 0.5 inch or greater.

18. The method according to claim 1 wherein the $M^{III}N$ layer is provided in a form selected from the group consisting of intrinsic $M^{III}N$, doped $M^{III}N$, and $M^{III}N$ alloys and compounds containing greater than 50% $M^{III}$ and N.

19. The method according to claim 1 comprising the steps of continuing to deposit the reactant vapor species on the growth surface whereby the $M^{III}N$ layer attains a thickness sufficient to enable removal of the template material, and removing the template material to provide a free-standing, single-crystal $M^{III}N$ article.

20. The method according to claim 19 wherein the $M^{III}N$ article is provided in a form selected from the group consisting of intrinsic $M^{III}N$, doped $M^{III}N$, and $M^{III}N$ alloys and compounds containing greater than 50% $M^{III}$ and N.

21. The method according to claim 19 wherein the $M^{III}N$ article has a diameter of approximately 2 inches or greater and a thickness of approximately 1 mm or greater.

22. The method according to claim 19 wherein the template material is removed by a removal technique selected from the group consisting of polishing, chemomechanical polishing, laser-induced liftoff, cleaving, wet etching, and dry etching.

23. The method according to claim 19 comprising the step of cutting a wafer from the $M^{III}N$ article.

24. The method according to claim 19 comprising the step of preparing a surface of the $M^{III}N$ article for epitaxial growth thereon.

25. The method according to claim 19 comprising the step of depositing an epitaxial layer on the $M^{III}N$ article.

26. The method according to claim 19 comprising the step of forming a device on the $M^{III}N$ article.

27. A bulk single-crystal $M^{III}N$ article produced according to the method of claim 19 wherein the article has a thickness of approximately 50 microns or greater.

28. A single-crystal $M^{III}N$ article produced according to the method of claim 19, wherein the article is in wafer form having a thickness ranging from approximately 50 microns to approximately 1 mm.

29. A single-crystal $M^{III}N$ article produced according to the method of claim 19, wherein the article is in boule form having a diameter of approximately 2 inches or greater and a thickness ranging from approximately 1 mm to greater than approximately 100 mm.

30. The method according to claim 19 wherein the $M^{III}N$ article has a thickness of approximately 50 microns or greater.

31. The method according to claim 30 wherein the $M^{III}N$ article has a diameter of approximately 0.5 inch or greater.

32. A method for producing a single-crystal $M^{III}N$ article comprising the steps of:

(a) providing a template material having an epitaxial-initiating growth surface;

(b) using a sputtering apparatus comprising a non-thermionic electron/plasma injector assembly to produce a Group III metal source vapor from a Group III metal target;

(c) combining the Group III metal source vapor with a nitrogen-containing gas to produce a reactant vapor species comprising Group III metal and nitrogen; and (d) depositing the reactant vapor species on the growth surface to produce a single-crystal $M^{III}N$ layer thereon having a thickness of greater than approximately 10 microns.

33. The method according to claim 32 wherein the injector assembly comprises a plurality of hollow cathode injectors disposed in fluid communication with a gas source, each injector including an orifice communicating with a sputtering chamber.

34. The method according to claim 32 wherein the injector assembly comprises:

(a) a main body having a generally annular orientation with respect to a central axis and including a process gas section and a cooling section, the process gas section defining a process gas chamber and the cooling section defining a heat transfer fluid reservoir; and (b) a plurality of gas nozzles removably disposed in the main body in a radial orientation with respect to the central axis and in heat transferring relation to the heat transfer fluid reservoir, each gas nozzle providing fluid communication between the process gas chamber and a region exterior to the main body.

35. The method according to claim 32 comprising the step of removing the template material, thereby providing a free-standing, single-crystal $M^{III}N$ article.

36. A bulk single-crystal $M^{III}N$ article produced according to the method of claim 32 wherein the article has a thickness of approximately 50 microns or greater.

37. A single-crystal $M^{III}N$ article produced according to the method of claim 32, wherein the article is in wafer form having a thickness ranging from approximately 50 microns to approximately 1 mm.

38. A single-crystal $M^{III}N$ article produced according to the method of claim 32, wherein the article is in boule form having a diameter of approximately 2 inches or greater and a thickness ranging from approximately 1 mm to greater than approximately 100 mm.

39. A single-crystal $M^{III}N$ article produced according to the method of claim 32 at a growth rate greater than approximately 10 microns/hour.

40. The method according to claim 32 comprising the step of using the single-crystal $M^{III}N$ layer as a seed crystal and depositing additional reactant vapor species comprising a Group III metal and nitrogen on the $M^{III}N$ layer to produce a bulk $M^{III}N$ article.

41. A method for producing a bulk single-crystal $M^{III}N$ article comprising the steps of:

(a) providing a template material having an epitaxial-initiating growth surface;

(b) sputtering a Group III metal target in a plasma-enhanced environment to produce a Group III metal source vapor;

(c) combining the Group III metal source vapor with a nitrogen-containing gas to produce a reactant vapor species comprising Group III metal and nitrogen;

(d) depositing the reactant vapor species on the growth surface to produce a single-crystal $M^{III}N$ layer thereon; and (e) using the single-crystal $M^{III}N$ layer as a seed crystal to grow a bulk $M^{III}N$ layer having a thickness of greater than approximately 10 microns by depositing additional reactant vapor species comprising a Group III metal and nitrogen on the seed crystal.

42. The method according to claim 41 wherein the additional reactant species are deposited by a technique selected from the group consisting of physical vapor deposition, sputtering, molecular beam epitaxy, atmospheric chemical vapor deposition, low pressure chemical vapor deposition, plasma-enhanced chemical vapor deposition, metalorganic chemical vapor deposition, evaporation, sublimation, and hydride vapor phase epitaxy.

43. The method according to claim 41 comprising the step of cutting a wafer from the bulk $M^{III}N$ article.

44. The method according to claim 43 comprising the step of preparing a surface of the wafer for epitaxial growth thereon.

45. The method according to claim 44 comprising the step of depositing an epitaxial layer on the wafer.

46. The method according to claim 43 comprising the step of forming a device on the wafer.

47. A bulk single-crystal $M^{III}N$ article produced according to the method of claim 41 wherein the article has a thickness of approximately 50 microns or greater.

48. A single-crystal $M^{III}N$ article produced according to the method of claim 41, wherein the article is in wafer form having a thickness ranging from approximately 50 microns to approximately 1 mm.

49. A single-crystal $M^{III}N$ article produced according to the method of claim 41, wherein the article is in boule form having a diameter of approximately 2 inches or greater and a thickness ranging from approximately 1 mm to greater than approximately 100 mm.

* * * * *